(12) United States Patent
Tseng et al.

(10) Patent No.: US 12,040,785 B2
(45) Date of Patent: Jul. 16, 2024

(54) ROBUST TRANSISTOR CIRCUITRY

(71) Applicant: Qualcomm Incorporated, San Diego, CA (US)

(72) Inventors: Yi-Hung Tseng, San Diego, CA (US); Marzio Pedrali-Noy, San Diego, CA (US); Charles James Persico, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 17/485,005

(22) Filed: Sep. 24, 2021

(65) Prior Publication Data

US 2023/0107547 A1 Apr. 6, 2023

(51) Int. Cl.
*H03K 17/082* (2006.01)
*H02H 1/00* (2006.01)

(52) U.S. Cl.
CPC ......... *H03K 17/082* (2013.01); *H02H 1/0007* (2013.01)

(58) Field of Classification Search
CPC ........................... H03K 17/082; H02H 1/0007
See application file for complete search history.

(56) References Cited

U.S. PATENT DOCUMENTS

| | | | | |
|---|---|---|---|---|
| 4,751,405 A * | 6/1988 | Bufano, Jr. | ............... | H03K 5/24 327/205 |
| 4,992,755 A * | 2/1991 | Seevinck | ............. | H03F 1/3211 330/253 |
| 5,206,541 A * | 4/1993 | Boahen | ................... | G06N 3/065 706/18 |
| 5,408,462 A | 4/1995 | Opoczynski | | |
| 5,720,004 A * | 2/1998 | Li | ........................... | G06N 3/063 706/41 |
| 5,770,954 A * | 6/1998 | Tomasini | ............. | H03K 5/2472 327/63 |

(Continued)

FOREIGN PATENT DOCUMENTS

JP 2015208088 A 11/2015
RU 2442964 C1 2/2012

OTHER PUBLICATIONS

International Search Report and Written Opinion—PCT/US2022/075337—ISA/EPO—dated Dec. 21, 2022, 14 paGes.

(Continued)

*Primary Examiner* — Menatoallah Youssef
*Assistant Examiner* — Khareem E Almo
(74) *Attorney, Agent, or Firm* — QUALCOMM Incorporated

(57) ABSTRACT

An apparatus is disclosed for robust transistor circuitry. In example implementations, an apparatus includes a current mirror and fault handler circuitry that is coupled to the current mirror. The current mirror includes a core transistor having a control terminal, a first transistor, and a second transistor. The first transistor has a control terminal that is coupled to the control terminal of the core transistor. The second transistor has a control terminal that is coupled to the control terminal of the core transistor. The fault handler circuitry is configured to select the first transistor or the second transistor to provide a mirrored current of the current mirror.

40 Claims, 13 Drawing Sheets

(56) References Cited

U.S. PATENT DOCUMENTS

| | | | |
|---|---|---|---|
| 6,362,662 B1 * | 3/2002 | Shi | G06G 7/26 |
| | | | 327/63 |
| 6,421,286 B1 | 7/2002 | Ohtani et al. | |
| 6,538,496 B1 * | 3/2003 | Tanase | G05F 3/262 |
| | | | 327/543 |
| 6,625,072 B2 | 9/2003 | Ohtani et al. | |
| 6,798,253 B1 * | 9/2004 | Shi | H03K 5/1534 |
| | | | 327/63 |
| 6,895,537 B2 | 5/2005 | Kawagoe et al. | |
| 7,372,685 B2 | 5/2008 | Beck et al. | |
| 7,570,076 B2 | 8/2009 | Marshall et al. | |
| 8,362,794 B2 | 1/2013 | Chen et al. | |
| 8,619,445 B1 | 12/2013 | Low et al. | |
| 8,901,980 B1 * | 12/2014 | Naish | H03K 3/3565 |
| | | | 327/205 |
| 8,942,051 B2 | 1/2015 | Adham et al. | |
| 9,871,511 B2 | 1/2018 | Forney | |
| 10,170,992 B1 * | 1/2019 | Omole | H03F 3/45475 |
| 10,177,713 B1 * | 1/2019 | Far | H03F 1/0244 |
| 10,198,022 B1 * | 2/2019 | Far | G05F 3/08 |
| 10,277,141 B2 | 4/2019 | Moffat et al. | |
| 10,491,167 B1 * | 11/2019 | Far | H03F 3/04 |
| 10,560,058 B1 * | 2/2020 | Far | H03F 3/26 |
| 11,009,900 B2 * | 5/2021 | Ivanov | G05F 1/575 |
| 11,016,732 B1 * | 5/2021 | Far | G06N 3/063 |
| 2003/0204226 A1 | 10/2003 | Acosta et al. | |
| 2010/0194345 A1 * | 8/2010 | Li | G01R 31/396 |
| | | | 361/88 |
| 2010/0315847 A1 * | 12/2010 | Maher | H02M 3/1584 |
| | | | 363/50 |
| 2012/0163074 A1 * | 6/2012 | Franca-Neto | G11C 29/50004 |
| | | | 365/185.24 |
| 2012/0166897 A1 * | 6/2012 | Franca-Neto | G11C 29/50 |
| | | | 714/721 |
| 2014/0211562 A1 * | 7/2014 | Chang | G11C 16/10 |
| | | | 365/185.03 |
| 2014/0241036 A1 * | 8/2014 | Toda | G11C 13/0023 |
| | | | 365/148 |
| 2015/0338931 A1 | 11/2015 | Teh et al. | |
| 2017/0187199 A1 * | 6/2017 | Wei | H02J 7/00 |
| 2018/0196454 A1 * | 7/2018 | Ivanov | G05F 1/575 |
| 2022/0108736 A1 * | 4/2022 | Madhavan | G11C 5/06 |
| 2022/0391570 A1 * | 12/2022 | Al-Hemyari | G01R 31/72 |
| 2023/0098996 A1 | 3/2023 | Tseng | |

OTHER PUBLICATIONS

Ohata T., et al., "Fault Tolerance of Simplified Parallel Power Converters with Current Sharing Function", Circuits and Systems (APCCAS), 2012 IEEE Asia Pacific Conference on, IEEE, Dec. 2, 2012, XP032314848, pp. 104-107.

* cited by examiner

ROBUST TRANSISTOR CIRCUITRY

TECHNICAL FIELD

This disclosure relates generally to electronic devices with transistors and, more specifically, to making transistor circuitry more fault tolerant.

BACKGROUND

Electronic devices include traditional computing devices such as desktop computers, notebook computers, smartphones, wearable devices like a smartwatch, internet servers, and so forth. However, electronic devices also include other types of computing devices, such as personal voice-assistants, robotics, automotive electronics, thermostats and other sensors or automated controllers, digital components and devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi® network, or a cellular network. Electronic communications, therefore, include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. With a smartphone, mobile services can include audio and video calls, social media interactions, messaging, watching movies, sharing videos, performing searches, acquiring map information or navigational instructions, finding friends, location-based services generally, transferring money, ordering a good or service like a car ride, and so forth. Other services that can be enhanced with wireless communications include self-driving vehicles, augmented reality (AR) and other mixed reality (MR) imaging, on-the-go 4K video streaming, ubiquitous sensors to keep people safe and to use natural resources more efficiently, real-time language translations, and so forth.

To provide these and other types of services in a wireless environment, electronic devices typically use a wireless interface device to communicate wireless signals via an antenna. The wireless interface device can include, for example, a communication processor, a wireless transceiver, and a radio-frequency (RF) front-end, which interfaces with the antenna. To provide wireless services, especially newer ones that demand higher bandwidth and lower latency, the components of the wireless interface device will be expected to operate efficiently at higher frequencies, with lower power, and/or in rugged applications.

Providing wireless communications and associated services is contingent on an electronic device, including a wireless interface device thereof, operating in accordance with a manufacturer's specifications. If the wireless interface device malfunctions, the overall electronic device can be rendered nonfunctional, and a user may be inconvenienced or endangered. Manufacturers and retailers also incur costs when nonfunctioning electronic devices are returned by the user.

SUMMARY

As signal frequencies increase and power conservation efforts lead voltage levels to be reduced, the circuits of electronic devices become more prone to failure. Because nonfunctioning electronic devices incur costs, electrical engineers and other designers of electronic devices strive to develop more-reliable electronics. One circuit device that can fail during use is the transistor, even if the transistor passed multiple tests at a manufacturing facility before shipment. To make transistor circuitry more robust, this document describes certain techniques employing redundancy and fault handling circuitry, including with radio-frequency (RF) components. Two or more signals of at least one transistor-containing RE component can be replicated. The fault handler circuitry monitors at least one signal or one or more transistor-containing RF components to detect a fault. The fault handler circuitry ensures that at least a better signal is provided to a load that is associated with the RF component. In some cases, the fault handler circuitry can monitor two signals and route a superior signal to the load. In other cases, the fault handler circuitry can monitor a first signal and activate a second signal if the first signal fails to meet a threshold parameter value. In some described implementations, a transistor-containing RF component is realized with a current mirror, and/or the fault handler circuitry is realized with a winner-take-all (WTA) circuit. In these manners, circuitries that include transistors, including an RF component, can be made more robust.

In an example aspect, an apparatus for robust transistor circuitry is disclosed. The apparatus includes a current mirror and fault handler circuitry. The current mirror includes a core transistor having a control terminal. The current mirror also includes a first transistor having a control terminal coupled to the control terminal of the core transistor. The current mirror further includes a second transistor having a control terminal coupled to the control terminal of the core transistor. The fault handler circuitry is coupled to the current mirror. The fault handler circuitry is configured to select the first transistor or the second transistor to provide a mirrored current of the current mirror.

In an example aspect, an apparatus for robust transistor circuitry is disclosed. The apparatus includes core means for providing a core current. The apparatus also includes first means for mirroring the core current as a first current and second means for mirroring the core current as a second current. The apparatus further includes means for handling a fault of the first means or the second means by selecting the second current or the first current as a mirrored current.

In an example aspect, a method for operating robust transistor circuitry is disclosed. The method includes mirroring a core current as a first current and mirroring the core current as a second current. The method also includes detecting a parameter associated with the first current and a parameter associated with the second current. The method additionally includes comparing the parameter associated with the first current and the parameter associated with the second current. The method further includes selecting the first current or the second current as a mirrored current based on the comparing.

In an example aspect, an apparatus for robust transistor circuitry is disclosed. The apparatus includes at least one integrated circuit component configured to produce multiple currents. The apparatus also includes a winner-take-all (WTA) circuit coupled to the at least one integrated circuit component. The WTA circuit is configured to select a current of the multiple currents and apply the current to another component.

BRIEF DESCRIPTION OF DRAWINGS

FIGS. 4-1, 4-2, and 4-3 are schematic diagrams illustrating example implementations of the RF component and the associated fault handler circuitry of FIG. 4.

FIG. 5-1 is a schematic diagram illustrating example transistor implementations.

FIG. 5-2 is a schematic diagram illustrating example arrangements for connecting a transistor to at least one power distribution node.

FIG. 6-1 is a schematic diagram illustrating an example RF component that is implemented using a current mirror and that is coupled to fault handler circuitry.

FIG. 6-2 is a schematic diagram illustrating example fault handler circuitry that is implemented using a WTA circuit and that is coupled to at least one RF component.

DETAILED DESCRIPTION

Figure 1:
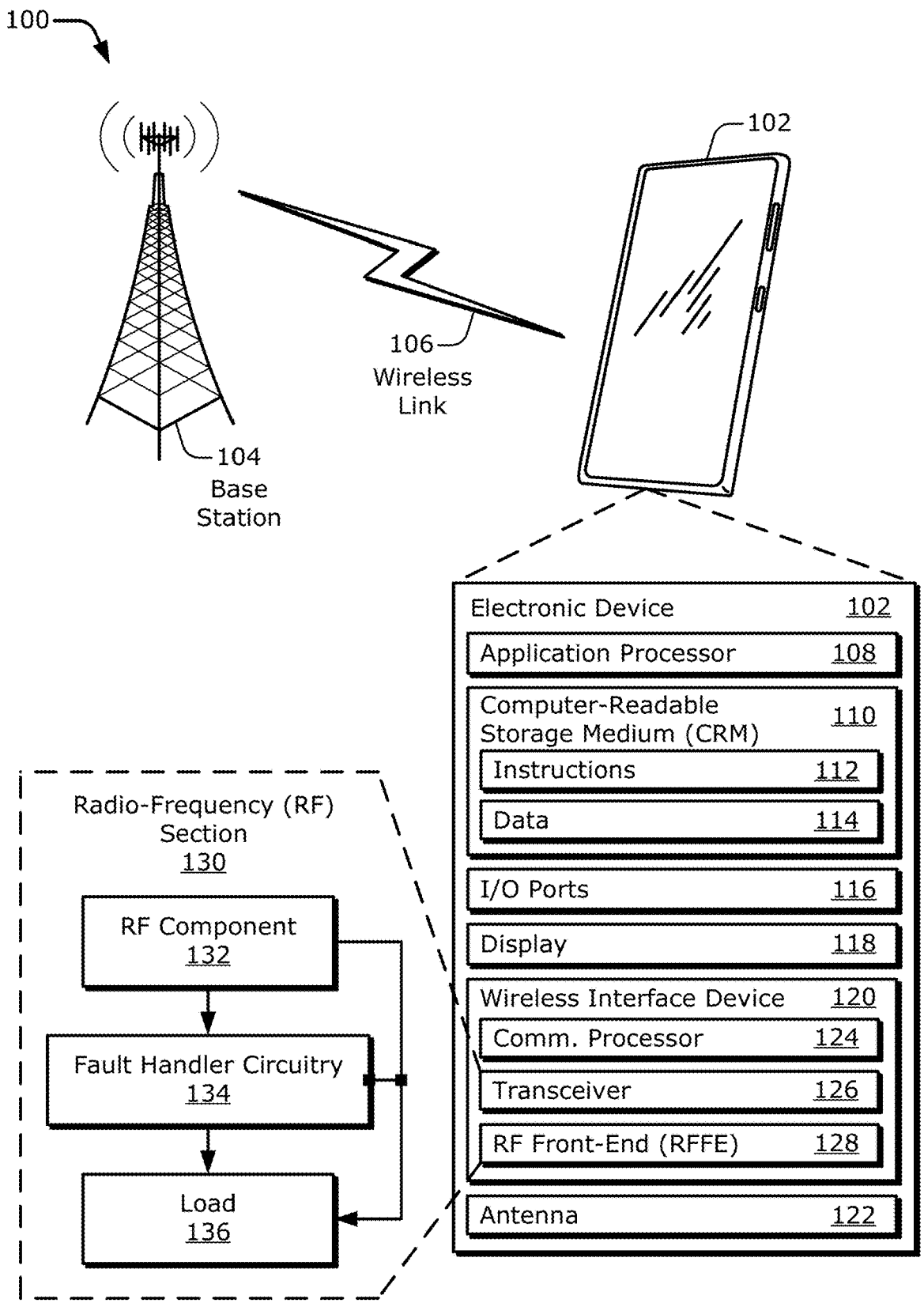
FIG. 1 illustrates an environment depicting an example electronic device having a wireless interface device including a radio-frequency (RF) component and fault handler circuitry to realize robust transistor circuitry.

Manufacturers produce electronic devices in a variety of types and form factors, and such electronic devices can provide the myriad of services in today's modern interconnected society. Electronic devices can include discrete circuit components as well as analog and digital integrated circuits. Integrated circuits can include thousands, millions, or even more fundamental components. Fundamental components can include both active and passive components, such as transistors, diodes, capacitors, resistors, and the like. The circuitry fabricated on the integrated circuit (IC) is carefully designed to perform designated functions under specified conditions to support some features of the electronic device.

Examples of such features are making wireless communications, presenting images on a display screen, enhancing photos, and so forth. If the conditions vary outside those that are specified, the IC may fail to achieve the designated functionality. The IC can also fail to achieve the designated functions if a component does not operate within specified parameters. Specified parameters may include a frequency of operation, an amplification gain, or a current magnitude. Examples of ICs include a general processor, a graphics processor, a system-on-chip (SoC), a modem, a security chip, and at least a portion of a transceiver or radio-frequency (RF) front-end. Each of these types of ICs has particular designated functions that may be important to the operation of an overall electronic device.

In some cases, if a single component, including a single fundamental component, of an IC fails to operate as intended by an IC designer, the entire IC can fail to perform one or more designated functions. Consequently, the failure of a one-thousandth portion or a one-millionth portion of an IC chip can render the entire chip unusable and worthless. This failure incurs at least the cost of the IC chip, and the defective IC chip can also break an electronic device that relies on the correct functioning of the chip.

One component that enables operation of many circuits is the transistor. Transistors include, for example, field-effect transistors (FETs) (e.g., a metal-oxide-semiconductor FET (MOSFET)) and bipolar junction transistors (BJTs). In addition to being part of digital ICs, transistors can be included in integrated analog circuits. Integrated analog circuits may be employed, for instance, in RF parts of an electronic device. Within a wireless interface device of an electronic device, RF integrated analog circuits can be in various parts of a transceiver or an RF front-end. Transistors can also be employed in discrete circuits.

In advanced nanometer technologies, integrated analog circuits are often biased at low current overdrive to reduce power usage, especially in battery-powered mobile applications. Transistor devices can be biased deep in a subthreshold voltage level. In other words, transistor devices may be "just barely" turned on to save power or to accelerate switching speed. Because these transistors are supplied with lower bias voltages, these devices are more susceptible to operational failure generally as compared to those transistor devices that are supplied with higher bias voltages that consume more power. Accordingly, transistor devices that are deployed in low-power environments are less likely to operate correctly due to the natural variances in bias threshold voltages that arise from fabrication.

Transistors, which may be considered fundamental components, are used in many different circuits or "higher-level" components, such as a phase-locked loop (PLL), a power management integrated circuit (PMIC), or a frequency converter. An example circuit that employs multiple transistors is the current mirror. A current mirror reproduces a current to create a copy, including a scaled copy, of an "original" current for signaling, measuring, or other purposes. Transistor devices in a current mirror configuration are particularly sensitive to device threshold voltage variations because the mirrors can "turn off" with voltage fluctuations of as few as 10s of millivolts (mV). Imperfections arising from IC fabrication, like during the photolithography procedure, can cause process defects in the silicon that produce device threshold voltage variations. These defects and resulting threshold voltage variations, which can be difficult to detect with initial factory testing, eventually lead to circuit failure.

Consequently, transistor devices, and associated circuitries, can function within target specifications at the beginning of a product's lifetime, but they eventually fail due to device aging, electrical stress, or unexpected damage. Typical reliability tests (e.g., high-temperature operating life (HTOL) and electrostatic discharge (ESD)) are intended to anticipate or capture this type of future failure during manufacturing, but many transistor devices that are destined to fail while in use go undetected during the testing conducted by the manufacturer. Products having ICs that pass these initial reliability tests can, therefore, still result in dissatisfaction and customer product returns once the transistor device fails during usage. Extending a product's reliable lifetime, on the other hand, can increase customer satisfaction and decrease returns.

To extend the reliable operating lifetime of electronic devices, this document describes techniques to increase the resiliency of components, including those that include transistor devices. Transistor circuit robustness is provided by incorporating component (e.g., transistor) redundancy and fault-handling circuitry to utilize the redundancy. In example implementations, a transistor-containing circuit can detect an issue with a transistor and implement a repair on the fly or in the field, including after a product has shipped or is in use by a customer. The transistor-containing circuit includes two or more transistors that can perform a given function. Fault-handling circuitry ensures that a usable transistor is operable to perform the given function, even if one transistor ceases to operate or eventually begins to operate outside of a specified range. This circuitry can be employed, for example, in an RF component of a wireless interface device, such as in a wireless transceiver or an RF front-end. For instance, redundant transistor circuitry and associated fault handler circuitry can augment or be included as part of a phase-locked loop (PLL) of an RF component.

In some implementations, an RF component has a transistor-containing circuit that includes a current mirror. The current mirror has a "core" transistor and at least two other transistors to mirror a "core" current flowing through the core transistor. The current mirror replicates or mirrors over the core current flowing through the core transistor to at least one of a first transistor or a second transistor to create at least one mirrored current. The RF component also includes or is associated with fault handler circuitry that is coupled to the current mirror. The fault handler circuitry selects a mirrored current from between the two or more other transistors of the current mirror for use in the RF component. In some cases, the fault handler circuitry identifies the second transistor to select a mirrored current if the first transistor fails. In other cases, the fault handler circuitry selects a mirrored current for use in the transistor-containing circuit based on which mirrored current is within specification (e.g., based on which mirrored current is within a target magnitude range or which mirrored current has a greater magnitude). An example of fault handler circuitry is a winner-take-all (WTA) circuit that identifies a current having a highest magnitude between two or more mirrored currents. The WTA circuit can apply the identified current to another component, such as by using a current mirror and/or current source scheme with respect to the other component.

In these manners, robust transistor circuitry can combat the likelihood of some transistor-containing circuits to fail over time while being operated by a user, even after passing manufacturing-based reliability tests. An RF component of an electronic device can include redundant circuitry, such as multiple transistors that can perform a same function. Associated fault handler circuitry monitors a transistor-containing circuit to detect a failure of a transistor of the multiple transistors. To address a detected failure, the fault handler circuitry can switch to using a correctly functioning transistor, which may entail selecting a redundant signal from the correctly functioning transistor or may involve activating the correctly functioning transistor of the redundant circuitry. By handling faults with redundant circuitry for an RF component, an electronic device can continue to provide wireless communications in a more reliable manner and/or for a longer time period as compared to an electronic device that does not practice the techniques described herein.

FIG. 1 illustrates an example environment 100 depicting an electronic device 102 having a wireless interface device 120 including a radio-frequency component 132 (RF component 132) and fault handler circuitry 134 to realize robust transistor circuitry. In the example environment 100, the electronic device 102 communicates with a base station 104 through a wireless link 106. In FIG. 1, the example electronic device 102 is depicted as a smartphone. However, the electronic device 102 may be implemented as any suitable computing or other electronic device. Examples include a cellular base station, broadband router, access point, cellular or mobile phone, user equipment (UE), gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a wireless communication signal. Although depicted as a base station tower of a cellular radio network, the base station 104 may represent or be implemented as another device, such as a satellite, terrestrial broadcast tower, access point, peer-to-peer device, mesh network node, another electronic device as described above generally, and so forth. Also, although the communication link is depicted as a wireless link 106, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102, an uplink of other data or control information communicated from the electronic device 102 to the base station 104, or both a downlink and an uplink communication. The wireless link 106 may be implemented using any suitable communication protocol or standard. Examples of such protocols and standards include a 3rd Generation Partnership Project Long-Term Evolution (3GPP LTE) standard, such as a 4th Generation (4G) or a 5th Generation (5G) cellular standard; an IEEE 802.11 standard, such as an 802.11g, ac, ax, ad, aj, or ay standard; an IEEE 802.16 standard (e.g., WiMAX®); a Bluetooth® standard; and so forth. In some implementations, the wireless link 106 may wirelessly provide power instead of or in addition to communication signaling, and the electronic device 102 or the base station 104 may comprise a power source or a power sink.

As shown, the electronic device 102 can include at least one application processor 108 and at least one computer-readable storage medium 110 (CRM 110). The application processor 108 may include any type of processor, such as a central processing unit (CPU) or a multicore or graphics processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, or other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, camera or other sensor ports, and so forth. The display 118 can be realized as a display screen or a projection that presents one or more graphical images provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 can further include at least one wireless interface device 120 and at least one antenna 122, which are coupled one to another. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with a cellular network via the base station 104 using the wireless interface device 120. However, the electronic device 102 may also or instead communicate directly with peer devices, an alternative wireless network, and the like using the wireless interface device 120.

As shown, the wireless interface device 120 can include at least one communication processor 124, at least one transceiver 126, and at least one radio-frequency front-end 128 (RFFE 128). The communication processor 124 can be coupled to the transceiver 126, and the transceiver 126 can be coupled to the RF front-end 128, which is coupled to the antenna 122. The communication processor 124 can also be "directly" coupled to the RF front-end 128. These components process data information, control information, and signals associated with communicating information for the electronic device 102 via the antenna 122.

The communication processor 124 may be implemented as part of a system-on-chip (SoC), as a modem baseband processor, or as a baseband radio processor (BBP) that realizes a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques, including those that are described herein.

Figure 2:
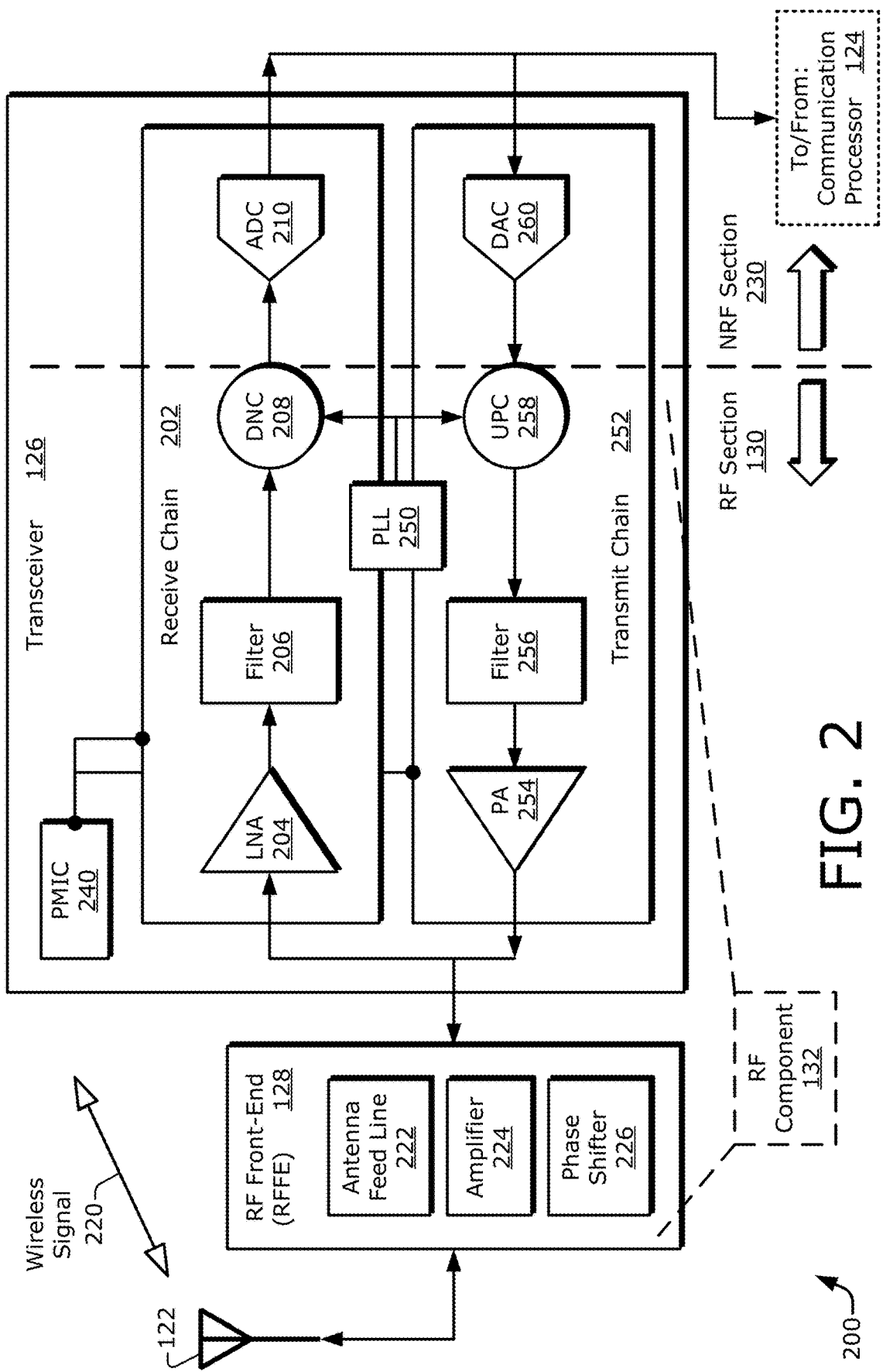
FIG. 2 is a schematic diagram illustrating an example transceiver and an example RF front-end that are separated into an RF section and a non-RF section.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118. This operative coupling enables control of, or other interaction with, the other components of the electronic device 102 by at least one processor. Additionally, the communication processor 124 may also include a memory (not separately shown), such as a CRM 110, to store data and processor-executable instructions (e.g., code). The various components that are illustrated in FIG. 1, FIG. 2, and other drawings using separate schematic blocks may be manufactured or packaged in different discrete manners. For example, one physical module may include components of the RF front-end 128 and some components of the transceiver 126, and another physical module may combine the communication processor 124 with the remaining components of the transceiver 126. Further, the antenna 122 may be co-packaged with at least some components of the RF front-end 128 or the transceiver 126.

The transceiver 126 can include circuitry and logic for filtering, amplification, channelization, and frequency translation. The frequency translation may include an up-conversion or a down-conversion of frequency that is performed in a single conversion operation (e.g., with a direct-conversion architecture) or through multiple conversion operations (e.g., with a superheterodyne architecture) using one or more mixers (not shown). Thus, the transceiver 126 can include filters, switches, amplifiers, mixers, and so forth for routing and conditioning signals that are transmitted or received via the antenna 122. Although not explicitly shown in FIG. 1, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them.

Configurable components of the transceiver 126 may be controlled by the communication processor 124 to implement communications in various modes, with different frequency bands, or to comport with a particular wireless standard. The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., to implement separate transmit and receive chains). The transceiver 126 may also include logic to perform in-phase/quadrature (I/Q) operations, such as synthesis, phase correction, modulation, demodulation, and the like.

Generally, the RF front-end 128 can include one or more filters, switches, amplifiers, or phase shifters for conditioning signals received via the antenna 122 or for conditioning signals to be transmitted via the antenna 122. The RF front-end 128 may also include other RF sensors and components, such as a peak detector, power meter, gain control block, antenna tuning circuit, diplexer, balun, and the like. Configurable components of the RF front-end 128, such as a phase shifter or mixer, may be controlled by the communication processor 124 to implement communications in various modes, with different frequency bands, or using beamforming. The RF front-end 128 of the wireless interface device 120 is coupled to the antenna 122. The antenna 122 can be implemented as at least one individual antenna, as at least one antenna array that includes multiple antenna elements, or as at least one antenna element of an antenna array. Thus, as used herein, an "antenna" can refer to an individual antenna, an antenna array, or an antenna element of an antenna array, depending on context.

In example implementations, the electronic device 102 includes a radio-frequency section 130 (RF section 130). In the RF section 130, at least one signal (e.g., a radio-frequency signal) may be propagated and/or processed at a frequency in the radio range of the electromagnetic spectrum. The radio-frequency range (RF range) of a given device can vary, for example, based on a wireless standard under which the electronic device operates. With a 4G device, for instance, a frequency can range from 600 megahertz (MHz) to 3 gigahertz (GHz), but an RF range is not limited thereto. With a 5G device, a frequency can range from 400 MHz to 6 GHz. Additionally or alternatively, with a 5G device, which is operating in accordance with a different aspect of 5G, a frequency can range from 24 GHz to 60 GHz, but an RF range is not limited to either of these two 5G examples. Generally, a given electronic device, or a wireless interface device thereof, can operate across the RF range as well as in one or more portions thereof and/or in accordance with one or more wireless standards. The RF section 130 can be part of the transceiver 126, part of the RF front-end 128, or part of both the transceiver 126 and the RF front-end 128. As illustrated, the RF section 130 can include at least one radio-frequency component 132, at least one instance of fault handler circuitry 134, and at least one load 136. The RF component 132 is coupled to the fault handler circuitry 134. The RF component 132 can include one or more transistors (not shown in FIG. 1). Together, the RF component 132 and the fault handler circuitry 134 can form at least part of robust transistor circuitry.

The RF component 132 or the fault handler circuitry 134 (including both with an inclusive-or interpretation of "or") can be coupled to the load 136. As depicted with arrows representing example signal flows, the RF component 132 can be directly coupled to the load 136 or indirectly coupled to the load 136 (e.g., via the fault handler circuitry 134). If the load 136 is present or used for a given operation, the RF component 132 can provide at least one signal to the load 136. The signal can provide power or data and can be realized using voltages or currents (including both).

In example operations, if the RF component 132 fails or is failing, the fault handler circuitry 134 detects the failure and takes action to remedy (e.g., ameliorate or overcome) the failure. In some cases, the RF component 132 includes multiple transistors, including at least one redundant transistor that can be used to replace a defective transistor. The fault handler circuitry 134 may detect, for instance, that a transistor is defective based on a signal output by the transistor. The output signal may be outside a range of specifications, may be inferior relative to (e.g., weaker than) another signal from another transistor, and so forth. The fault handler circuitry 134 operates to ensure that the load 136 receives a usable signal from the RF component 132, even if a component thereof fails.

By replacing a faulty component with a functioning component, the fault handler circuitry 134 can increase the reliability of the RF component 132 and hence the reliability of an entire IC chip. In some implementations, the RF component 132 includes a current mirror, and the current mirror includes multiple transistors, including at least one redundant transistor. The fault handler circuitry 134 can be realized using a winner-take-all (WTA) circuit that selects a mirrored current from a better functioning transistor to ensure the load 136 can perform within targeted parameters.

In some implementations, the fault handler circuitry 134 can be deployed outside of an RF section 130. Accordingly, the functionality of other component(s) that are part of a wireless interface device 120 (or part of another non-RF portion of the electronic device 102) can be made more robust to survive one or more faults. This enables the wireless interface device 120 (or the electronic device 102) to continue to operate even if other such components, such as at least one integrated circuit component generally, develops a fault after initial testing.

In some implementations, the fault handler circuitry 134 can be constructed using at least one explicit or architected comparator. Using such a comparator enables a wider variety of parameters to be considered when detecting whether a component is faulty. Further, a characteristic of the component being monitored can be compared to an objective parameter, which may be non-relative to other characteristics of the monitored component, using such a comparator. A result of a comparison, or an output of the comparator, can be used to select a desired parameter, a component producing the desired parameter, or a part of the component that is providing the desired parameter. Using a comparator enables a determination of whether a parameter is outside a desired range of the parameter and/or a determination of which parameter has a higher or lower quality than the other parameter.

In some implementations, the fault handler circuitry 134 can be constructed using a WTA circuit. Using a WTA circuit can combine operations of detecting and selecting with respect to a part of a component being monitored or a parameter thereof. For example, a WTA circuit can implicitly compare a parameter of multiple parts of a component and select the component or a parameter associated therewith for outputting or additional use. The parameter may correspond to a current or a voltage of the multiple parts. This enables respective parameters of respective parts of a component to be compared to each other and selection to be based thereon (e.g., based on which is greater or lesser than the other). Using a WTA circuit enables a determination of which parameter of two or more parameters has a higher or lower (including highest or lowest) quality (e.g., magnitude, frequency, or variability) relative to the other parameter.

In some implementations, the component being monitored can include a current mirror. Monitoring a current mirror can detect if a mirrored current is inadequate relative to an objective level or inferior relative to another mirrored current. This can protect the functionality of a larger circuit because current mirror transistors may be more sensitive to failure than some other transistors. An explicit comparator-based realization of fault handler circuitry can provide flexibility for analyzing various aspects of a current mirror. A WTA-circuit-based realization of fault handler circuitry can simply analyze a current mirror and select a current having a superior quality. For example, the WTA circuit can combine detection—with an implicit comparison—and selection of a current having a superior quality of a given parameter, such as a magnitude. Further, the WTA circuit can apply the selected current to another component in conjunction with the detection and selection, such as by using a mirroring technique to produce a current for a load.

Although a single instance of each of the RF component 132, the fault handler circuitry 134, and the load 136 are explicitly shown, the RF section 130 may include fewer or more of such components. Example components that are part of an RF section 130 are described next in relation to an example transceiver 126 and an example RF front-end 128.

FIG. 2 is a schematic diagram 200 illustrating an example transceiver 126 and an example RF front-end 128 that are separated into the RF section 130 and a non-RF (NRF) section 230 (NRF section 230). As illustrated from left to right, the antenna 122 is coupled to the RF front-end 128, and the RF front-end 128 is coupled to the transceiver 126. The transceiver 126 is coupled to the communication processor 124 (of FIG. 1). The example RF front-end 128 can include at least one antenna feed line 222, at least one amplifier 224, and at least one phase shifter 226. The example transceiver 126 can include at least one receive chain 202, at least one transmit chain 252, and at least one power management integrated circuit 240 (PMIC 240).

Although only one PMIC 240 is shown, an electronic device 102, or a wireless interface device 120 thereof, can include multiple PMICs 240 to support multiple power domains, to provide multiple different supply voltages, to enable redundancy for supplying power, and so forth. Although only one RF front-end 128 and one transceiver 126 are shown, an electronic device 102, or a wireless interface device 120 thereof, can include multiple instances of any or all such components. Also, although only certain components are explicitly depicted in FIG. 2 and are shown coupled together in a particular manner, the RF section 130 and the NRF section 230 may include other non-illustrated components, more or fewer components, differently coupled arrangements of components, and so forth.

In some implementations for a radio-frequency front-end, the RF front-end 128 couples the antenna 122 to the transceiver 126 via the antenna feed line 222. In operation, the antenna feed line 222 propagates a signal between the antenna 122 and the transceiver 126. During or as part of the propagation, the antenna feed line 222 can condition the propagating signal. This enables the RF front-end 128 to couple one or more wireless signals 220 from the antenna 122 to the transceiver 126 as part of a reception operation. The RF front-end 128 also enables a transmission signal to be coupled from the transceiver 126 to the antenna 122 as part of a transmission operation to emanate one or more wireless signals 220. The amplifier 224 may be implemented with, for example, a power amplifier or a low-noise amplifier (LNA). Although not explicitly shown in FIG. 2, an RF front-end 128, or an antenna feed line 222 thereof, may include one or more other components, such as a filter, a power meter, a balun, an N-plexer, and so forth.

In some implementations for a transceiver, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a downconverter 208 (DNC 208) for frequency down-conversion, and an ADC 210. The transmit chain 252 includes a power amplifier 254 (PA 254), a filter 256, an upconverter 258 (UPC 258) for frequency up-conversion, and a DAC 260. However, the receive chain 202 or the transmit chain 252 can include other components-such as additional amplifiers or filters, multiple mixers, individual phase-locked loops (PLLs), one or more buffers, or at least one local oscillator—that are electrically coupled anywhere along the depicted receive and transmit chains.

The illustrated receive chain 202 is coupled between the antenna feed line 222 of the RF front-end 128 and the communication processor 124—e.g., via the low-noise amplifier 204 and the ADC 210, respectively. The illustrated transmit chain 252 is coupled between the antenna feed line 222 and the communication processor 124—e.g., via the power amplifier 254 and the DAC 260, respectively. The transceiver 126 can include at least one phase-locked loop 250 (phase-locked loop 250 (PLL 250)), one PLL for each receive/transmit chain pair, one PLL per receive chain and one PLL per transmit chain, multiple PLLs, and so forth. The illustrated at least one PLL 250 is coupled to the DNC 208 and/or the UPC 258 to provide a stable frequency for a mixer of the DNC 208 to perform frequency down-converting or for a mixer of the UPC 258 to perform frequency upconverting.

As shown for the receive chain 202, the antenna 122 is coupled to the low-noise amplifier 204 via the antenna feed line 222, and the low-noise amplifier 204 is coupled to the filter 206. The filter 206 is coupled to the DNC 208, and the DNC 208 is coupled to the ADC 210. The ADC 210 is in turn coupled to the communication processor 124. As shown for the transmit chain 252, the DAC 260 is coupled to the communication processor 124. The DAC 260 is also coupled to the UPC 258. The UPC 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components.

This document now describes an example signal-receiving operation that includes the receive chain 202 of the transceiver 126. As part of the signal-receiving operation, the antenna 122 receives a wireless signal 220. The antenna 122 can be implemented as an individual antenna, as an antenna array, as an antenna element of an antenna array, and so forth. The antenna 122 provides the wireless signal 220 to the RF front-end 128, and the RF front-end 128 uses at least the antenna feed line 222 to forward the corresponding wired signal in the RF domain to the transceiver 126. Thus, the antenna 122 can provide the wireless signal 220 to the low-noise amplifier 204 of the receive chain 202 after conditioning or other signal manipulation by the antenna feed line 222 or another component of the RF front-end 128. The low-noise amplifier 204 amplifies the manipulated signal to produce an amplified signal. The low-noise amplifier 204 provides the amplified signal to the filter 206. The filter 206 filters (e.g., low-pass filters or bandpass filters) the amplified signal by attenuating some range or ranges of frequencies to produce a filtered signal that has one or more frequency bands attenuated. The filter 206 provides the filtered signal to the DNC 208.

The DNC 208 performs frequency conversion on the RF filtered signal to down-convert from one frequency to a lower frequency, such as from a radio frequency (RF) to an intermediate frequency (IF), from a RF directly to a baseband frequency (BBF), and so forth. The DNC 208 can perform the frequency down-conversion in a single conversion step, or through multiple conversion steps, using at least one PLL 250 that generates a signal having a synthesized frequency. Thus, the DNC 208 accepts the filtered signal from the filter 206 and performs a frequency down-conversion operation on the filtered signal to produce a down-converted signal in the NRF domain.

The DNC 208 provides the down-converted signal to the ADC 210. The ADC 210 converts the analog down-converted signal to a digital signal. The ADC 210 provides the digital signal to the communication processor 124. The communication processor 124 can perform demodulation, decoding, and so forth on the digital signal at baseband frequency to produce a data signal. The communication processor 124 then provides the data signal to other components, such as the application processor 108 (of FIG. 1), for further processing (e.g., for processing at an application level) to display images on a screen, conduct a transaction, and so forth. Generally, a given component may convert between analog signals and digital signals. Thus, the ADC 210 is an example of such a component that converts from analog signals to digital signals. The DAC 260 is an example of such a component that converts from digital signals to analog signals.

As part of an example signal-transmitting operation that includes the transmit chain 252, the DAC 260 accepts a digital signal from the communication processor 124. The DAC 260 converts the digital signal to an analog signal, which is at a baseband frequency (BBF) or an intermediate frequency (IF) in the NRF section 230. The DAC 260 forwards the analog signal to the UPC 258. The UPC 258 accepts the analog signal from the DAC 260 and upconverts the analog signal to a higher frequency, such as an RF frequency, to produce an RF signal. The UPC 258 can produce the RF signal using a signal generated by the PLL 250 that has a synthesized frequency that is derived from a local oscillator (LO) (not shown). The UPC 258 provides the RF signal to the filter 256. The filter 256 filters the RF signal to attenuate one or more frequency ranges and produces a filtered signal, which the filter 256 provides to the power amplifier 254. The power amplifier 254 accepts and amplifies the filtered signal to generate an amplified signal in the RF domain. The power amplifier 254 drives the amplified signal onto the antenna feed line 222 for signal conditioning. The RF front-end 128 provides the conditioned signal to the antenna 122 for emanation as another wireless signal 220.

Example implementations that are described above include at least two frequency domains as represented by the RF section 130 and the NRF section 230 (or other frequency (OF) section 230). Each depicted component is disposed in a different frequency domain—e.g., on a particular side of a frequency converter. Each frequency converter (e.g., the DNC 208 and the UPC 258) receives a signal and produces a frequency-converted signal to establish or create at least two frequency sections or at least two frequency domains. Thus, in this example for the transmit chain 252, the filter 256 is on one side of the UPC 258 (e.g., in an RF domain), and the DAC 260 is on the other side of the UPC 258 (e.g., in an IF or BBF domain). Similarly, in this example for the receive chain 202, the ADC 210 is on one side of the DNC 208 (e.g., in the IF or BBF domain), and the low-noise amplifier 204 is on the other side of the DNC 208 (e.g., in the RF domain).

Thus, the DNC 208 can establish an example demarcation between the RF section 130 and the NRF section 230 for reception-oriented circuitry. In described implementations, the DNC 208 down-converts from RF to some other non-RF, such as IF or BBF. Accordingly, each of the components that are disposed between the antenna 122 and at least part of the DNC 208 can correspond to an RF component 132 that may operate at a radio frequency. Similarly, the UPC 258 establishes an example demarcation between the NRF section 230 and the RF section 130 for transmission-related circuitry. In described implementations, the UPC 258 upconverts from some NRF, such as IF or BBF, to a RF. Accordingly, each of the components that are disposed between at least part of the UPC 258 and the antenna 122 can correspond to an RF component 132 that may operate at a radio frequency. For example, RF components 132 can include a filter 206 or a power amplifier 254. Also, a PMIC 240 that provides power to RF circuitry can correspond to an RF component 132. Further, a PLL 250 that provides a frequency to RF circuitry can correspond to an RF component 132.

This document describes some apparatuses and techniques as being applicable to an RF component 132 and/or an RF section 130 of a wireless interface device 120. Described implementations, however, can additionally or alternatively be included in other components and/or parts of an electronic device. For example, implementations can be deployed in the NRF section 230 of the wireless interface device 120. Fault handler circuitry 134 may, for instance, be included as part of the ADC 210, the DAC 260, the communication processor 124, a BBF component (e.g., a baseband filter or another BBF analog circuit), and so forth. Accordingly, in some cases, the fault handler circuitry 134 may be coupled to, and may be monitoring for faults, a NRF component (e.g., may be monitoring a current mirror or another circuit in the NRF section 230). In some of such cases, the fault handler circuitry 134 may be realized with a WTA circuit (e.g., of FIG. 4).

Figure 3:
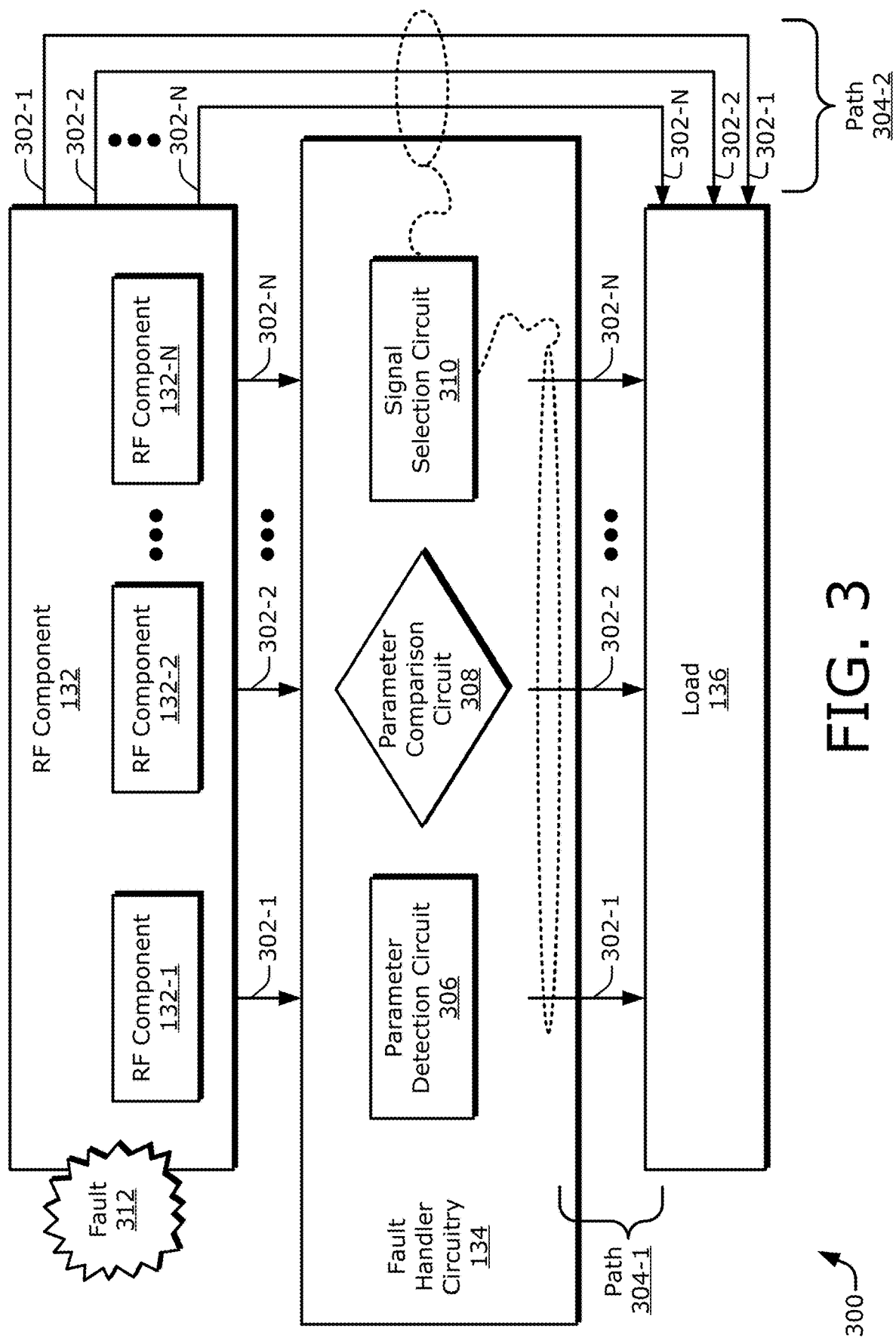
FIG. 3 is a schematic diagram illustrating an example RF component, example fault handler circuitry, and an example load.

FIG. 3 is a schematic diagram 300 illustrating an example RF component 132, example fault handler circuitry 134, and an example load 136. In example implementations, the RF component 132 may include multiple RF components 132-1, 132-2, . . . 132-N, with "N" representing a positive integer. For instance, an RF component 132 that is realized as a PLL (e.g., a PLL 250) may include a phase-frequency detector (PFD) that corresponds to a first RF component 132-1 and sigma-delta modulator that corresponds to a second RF component 132-2. Alternatively, an RF component 132 that is realized as a current mirror may include a transistor that corresponds to an RF component 132-1 and another transistor that corresponds to another RF component 132-2.

In operation, the RF component 132 generates at least one signal 302. As shown, the RF component 132 produces multiple signals 302-1 . . . 302-N, including a first signal 302-1, a second signal 302-2, . . . , an "Nth" signal 302-N, where "N" represents a positive integer. The RF component 132 forwards or otherwise provides one or more of the multiple signals 302-1 . . . 302-N to the load 136. The load 136, therefore, receives one or more of the multiple signals 302-1 . . . 302-N directly or indirectly from the RF component 132. The multiple signals 302-1 . . . 302-N may provide power to the load 136, may provide information/data to the load in terms of a voltage level and/or a current magnitude, may be realized as direct-current (DC) or alternating current (AC) signals, and so forth. For example, if the RF component 132 includes a phase-frequency detector (PFD), the load 136 may include a charge pump that receives a charge indicator signal 302 from the PFD. If the RF component 132 includes a current mirror, the load 136 may include another RF circuit that receives a current signal 302 that is being sourced or sunk responsive to a mirrored current of the current mirror. The other RF circuit, for instance, may be responsible for monitoring the core current of the current mirror using the mirrored current or may be biased based on the mirrored current.

The fault handler circuitry 134 can detect and at least ameliorate a fault condition of the RF component 132. The RF component 132 forwards or otherwise provides one or more of the multiple signals 302-1 . . . 302-N to the fault handler circuitry 134. The fault handler circuitry 134, therefore, receives one or more of the multiple signals 302-1 . . . 302-N from the RF component 132. The fault handler circuitry 134 can operate based on the multiple signals 302-1 . . . 302-N. If the fault handler circuitry 134 detects a fault 312 of the RF component 132, the fault handler circuitry 134 can adjust operation of the RF component 132 and/or affect one or more of the multiple signals 302-1 . . . 302-N to at least partially counteract the fault.

In some cases, as represented by a first path 304-1, at least a portion of the multiple signals 302-1 . . . 302-N traverse part of the fault handler circuitry 134 before being forwarded to the load 136. In other cases, as represented by a second path 304-2, at least a portion of the multiple signals 302-1 . . . 302-N bypass the fault handler circuitry 134. In such latter cases, the RF component 132 can provide the portion of the multiple signals 302-1 . . . 302-N to the load 136 via the second path 304-2 without at least that portion of the multiple signals 302-1 . . . 302-N traversing the fault handler circuitry 134. In still other cases, some of the multiple signals 302-1 . . . 302-N may follow the first path 304-1, and other ones of the multiple signals 302-1 . . . 302-N may follow the second path 304-2. Thus, a particular signal may traverse one path but not the other (e.g., the first signal 302-1 may follow the first path 304-1 but not the second path 304-2) in a given implementation.

In example implementations, the fault handler circuitry 134 includes at least one parameter detection circuit 306, at least one parameter comparison circuit 308, and at least one signal selection circuit 310. The parameter detection circuit 306 can detect one or more parameters that are associated with at least a portion of the multiple signals 302-1 . . . 302-N or that are otherwise related to the RF component 132. Examples of parameters include a voltage level or amplitude, a current magnitude, a noise level, a frequency, a waveform shape, a power draw or consumption, and so forth.

The parameter comparison circuit 308 can compare at least one parameter that is detected by the parameter detection circuit 306. The comparison operation may involve comparing the detected parameter to at least one specified value, such as a reference value representing a target specification. The comparison operation may determine, for instance, if the detected parameter is above a threshold, is between two reference values, and so forth. Additionally or alternatively, the comparison operation may entail comparing two or more detected parameters of the RF component 132 to each other. To implement such an "internal component" comparison operation, the parameter comparison circuit 308 may determine, for example, which signal of the multiple signals 302-1 . . . 302-N has a superior value, such as a higher current magnitude or a lower noise floor.

The signal selection circuit 310 can select between two or more of the multiple RF components 132-1 . . . 132-N and/or between two or more of the multiple signals 302-1 . . . 302-N. The signal selection circuit 310 can base the selection on at least one detected parameter from the parameter detection circuit 306 or on one or more comparisons performed by the parameter comparison circuit 308 (including on both a detected parameter and a comparison operation).

For example, the signal selection circuit 310 can enable a signal 302 with a superior (including a best) parameter quality to be provided to the load 136. The signal selection circuit 310 may alternatively permit each signal 302 of the multiple signals 302-1 . . . 302-N that meets at least one threshold to be forwarded to the load 136.

Figure 4:
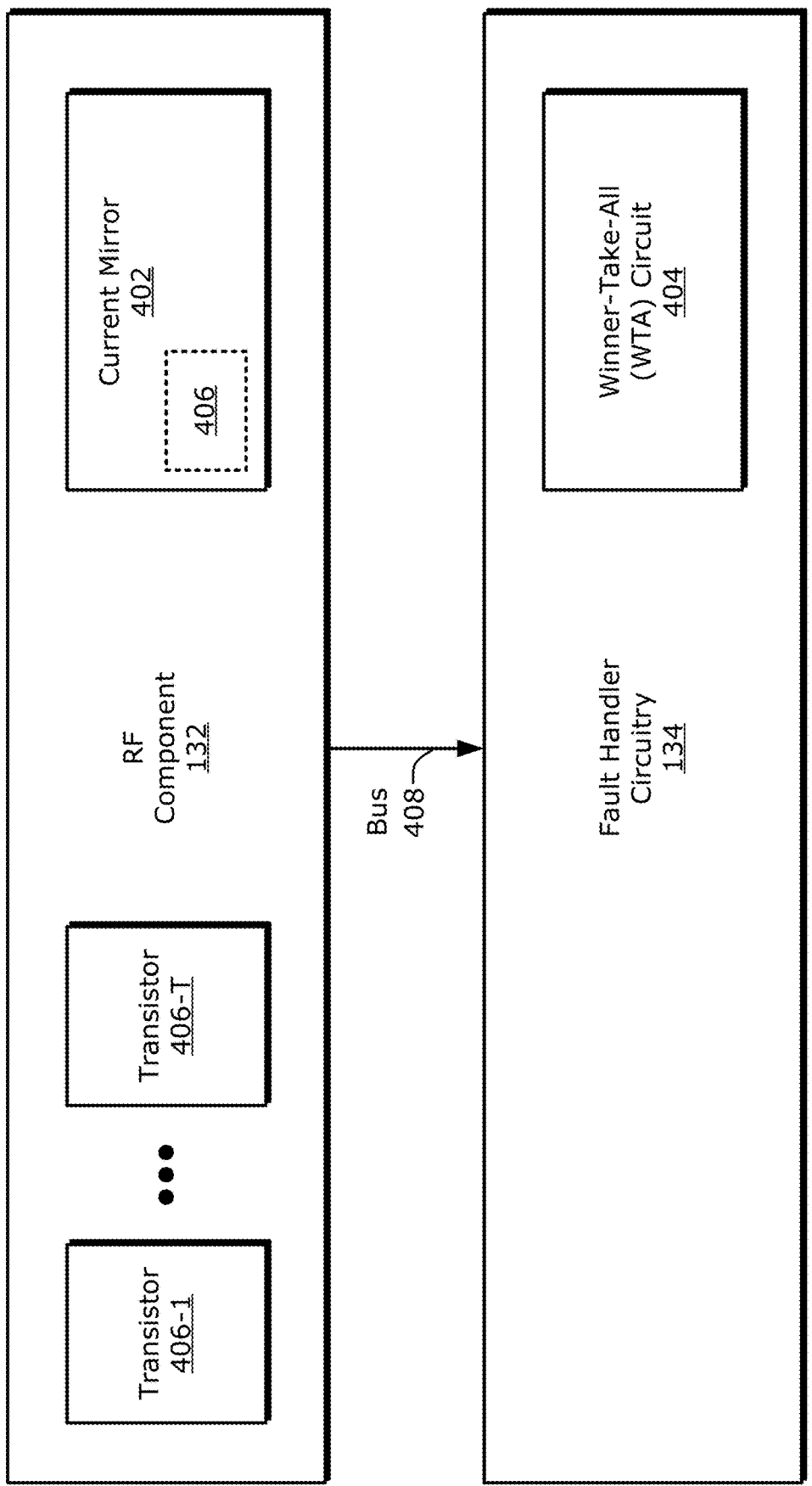
FIG. 4 is a schematic diagram illustrating example aspects of an RF component, which can include multiple transistors, and associated fault handler circuitry, which may be realized using a winner-take-all (WTA) circuit.
Figures 1, 4:
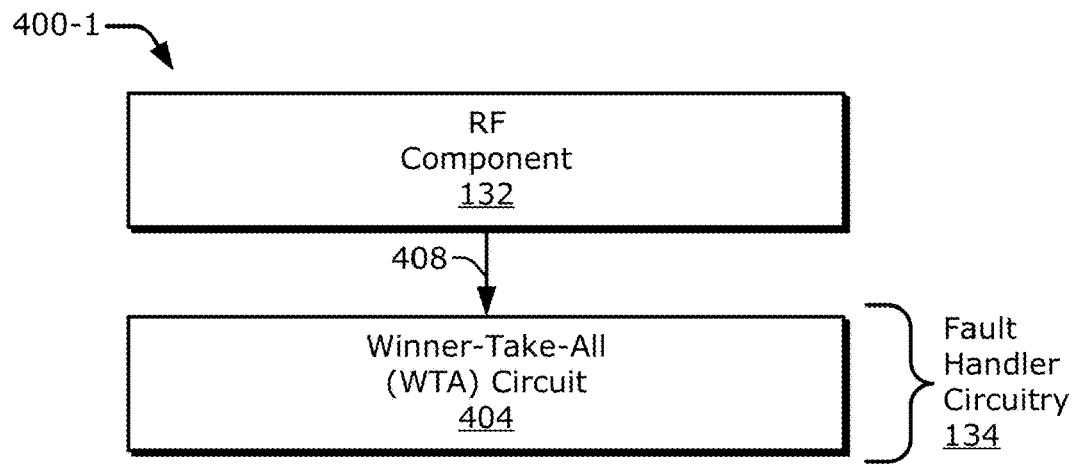
Figures 2, 4:
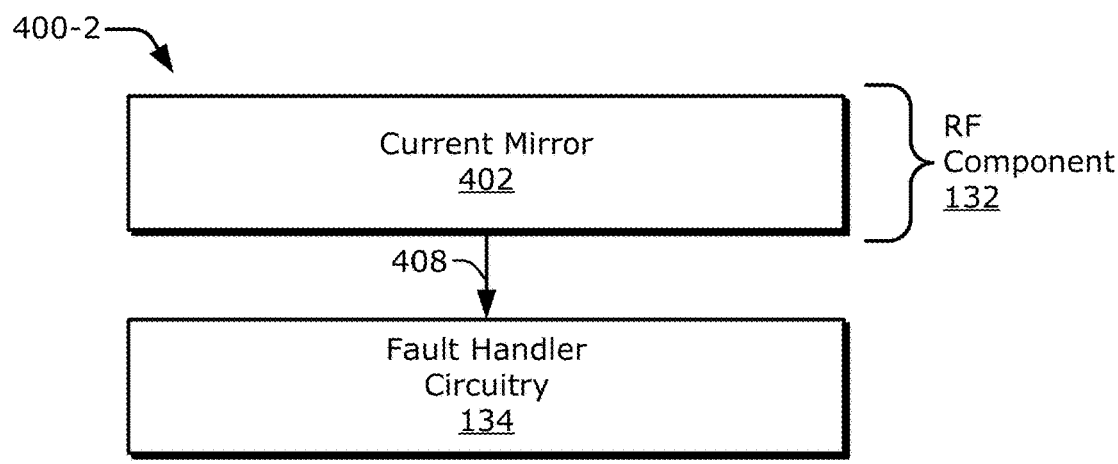
Figures 3, 4:
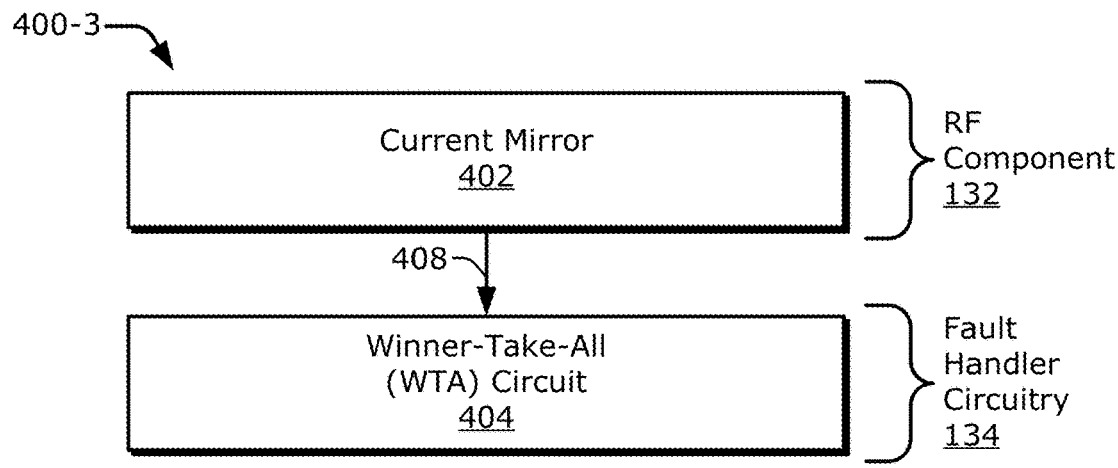

The signal selection circuit 310 can act with respect to at least one signal 302 that is traversing the first path 304-1 and/or with respect to at least one signal 302 that is traversing the second path 304-2 to accomplish a signal selection operation. For example, the signal selection circuit 310 can forward a selected signal 302 from the fault handler circuitry 134 to the load 136 using the first path 304-1. Additionally or alternatively, the signal selection circuit 310 may activate or deactivate (e.g., turn on or decouple from power) one or more of the multiple RF components 132-1 . . . 132-N to select a signal 302 that is to be provided to the load 136 via the second path 304-2. FIGS. 4 to 4-3, which are described next, illustrate example implementations of the RF component 132 in conjunction with the fault handler circuitry 134.

FIG. 4 is a schematic diagram 400 illustrating example aspects of an RF component 132, which can include multiple transistors, and associated fault handler circuitry 134, which may be realized using a winner-take-all (WTA) circuit. As shown, the RF component 132 is coupled to the fault handler circuitry 134 via at least one bus 408. The bus 408 can include one or more signaling lines, wires, conductive paths, or metallic traces to communicate current information and/or voltage information between the RF component 132 and the fault handler circuitry 134. The RF component 132 may include multiple transistors 406-1 . . . 406-T, with "T" representing a positive integer greater than one. In some cases, a respective transistor 406 may correspond to a respective RF component of the multiple RF components 132-1 . . . 132-N (e.g., of FIG. 3).

In example implementations, the RF component 132 may be realized using at least one current mirror 402. The current mirror 402 may include multiple instances of a transistor 406. Examples of a circuit diagram, and operation thereof, for a current mirror 402 are described below with reference to FIGS. 6-1, 7, and 8. The fault handler circuitry 134 may be realized using at least one winner-take-all (WTA) circuit 404 (WTA circuit 404). Generally, a WTA circuit 404 can be realized as a current-based or a voltage-based WTA circuit 404. Examples of a circuit diagram, and operation thereof, for a WTA circuit 404 are described below with reference to FIGS. 6-2, 7, and 8. Example aspects of a transistor 406 are described below with reference to FIGS. 5-1 and 5-2. Next, however, this document describes various example permutations of the schematic diagram 400 of FIG. 4.

FIGS. 4-1, 4-2, and 4-3 are respective schematic diagrams 400-1, 400-2, and 400-3 illustrating example implementations of the RF component 132 and the associated fault handler circuitry 134 of FIG. 4. In the example schematic diagram 400-1 of FIG. 4-1, the fault handler circuitry 134 is realized as a WTA circuit 404. The WTA circuit 404 is coupled to a general RF component 132. In the example schematic diagram 400-2 of FIG. 4-2, the RF component 132 is realized as a current mirror 402. The current mirror 402 is coupled to general fault handler circuitry 134. In the example schematic diagram 400-3 of FIG. 4-3, the RF component 132 is realized as a current mirror 402, and the fault handler circuitry 134 is realized as a WTA circuit 404. The current mirror 402 is thus coupled to the WTA circuit 404.

Figures 1, 5:
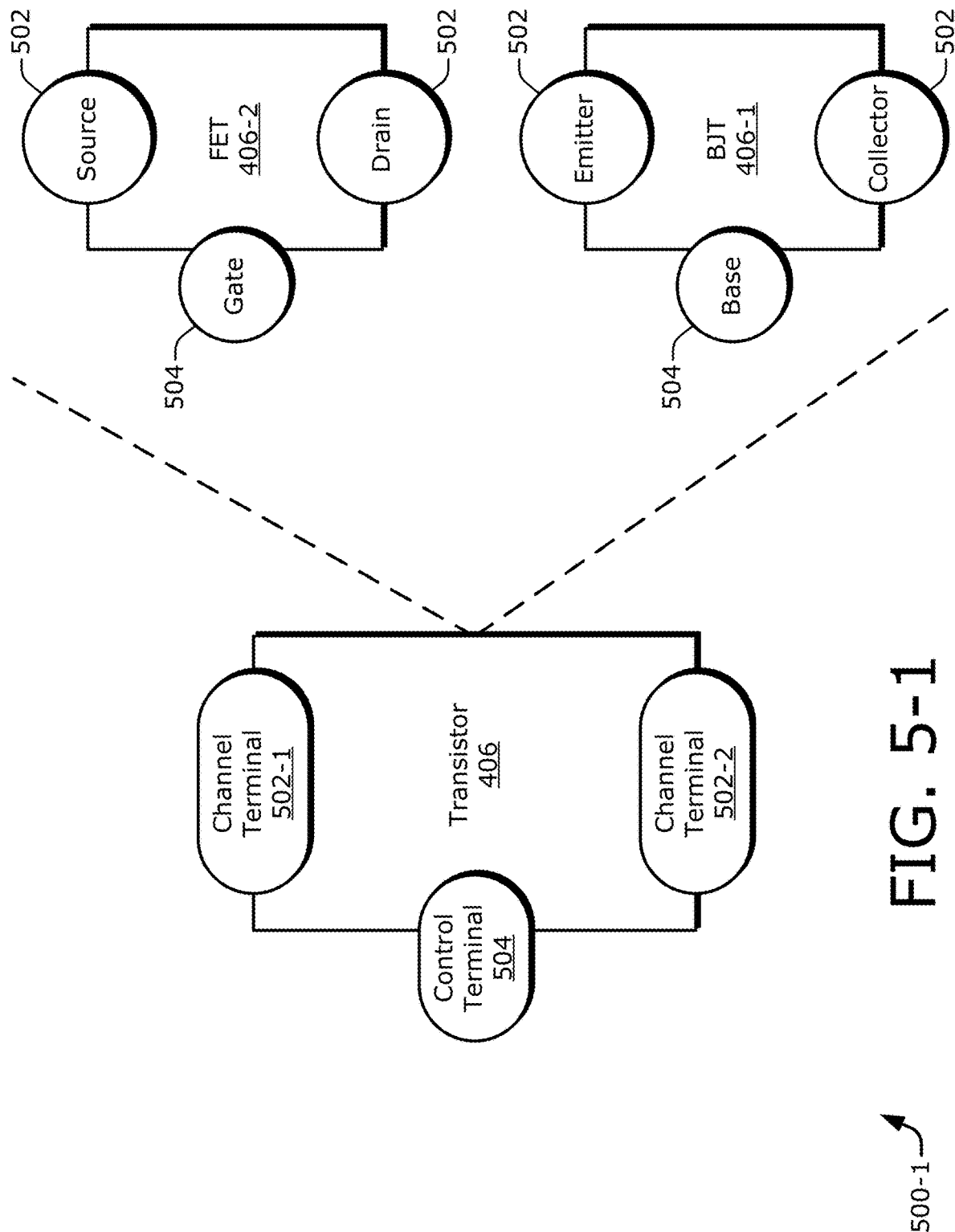
Figures 2, 5:
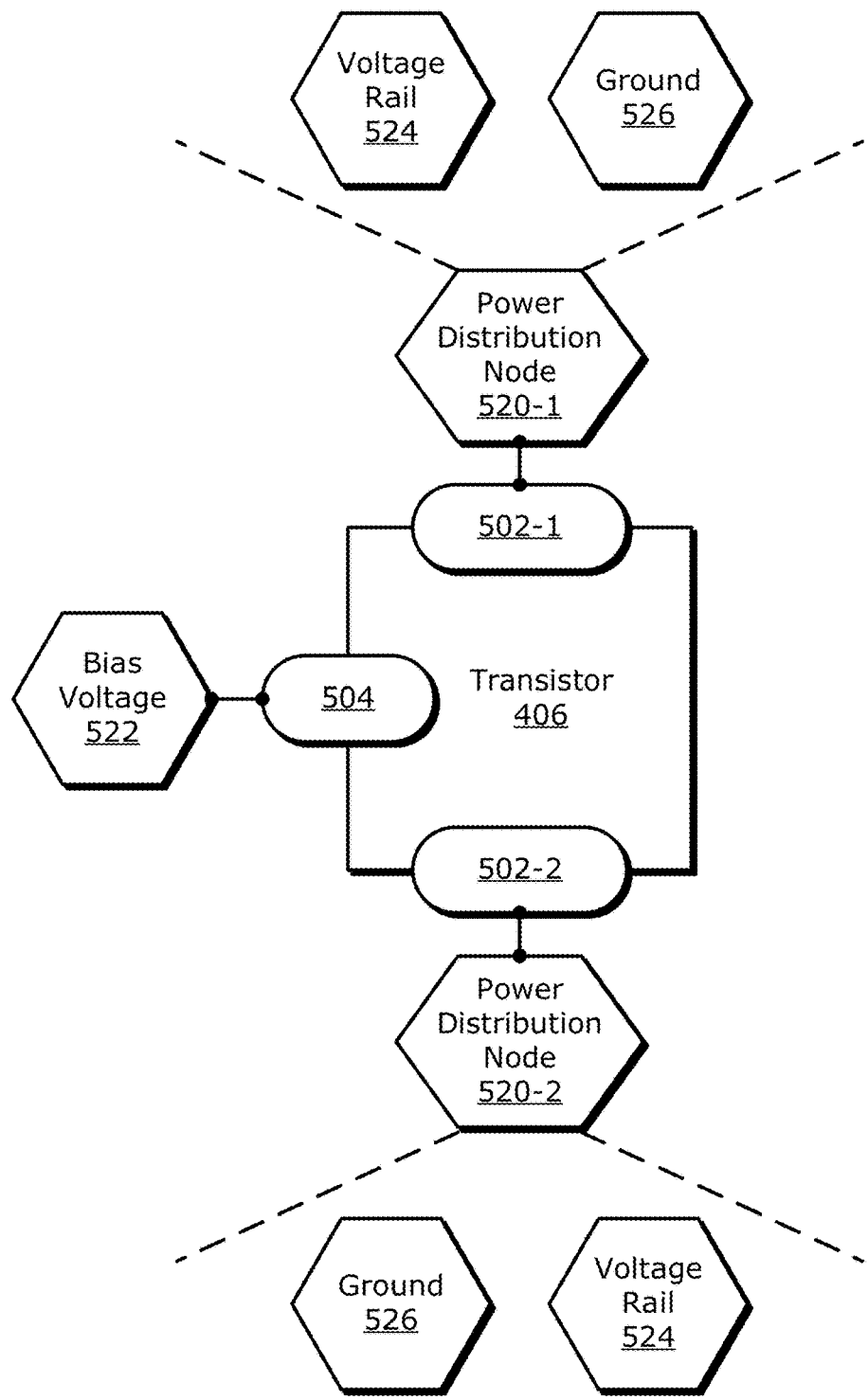

FIG. 5-1 is a schematic diagram 500-1 illustrating example transistor implementations. A transistor 406 is depicted with multiple terminals, such as three terminals: a first terminal, a second terminal, and a third terminal. As shown, the transistor 406 includes at least one control terminal 504 and two or more channel terminals 502-1 and 502-2. Generally, a current can flow between a first channel terminal 502-1 and a second channel terminal 502-2 of the transistor 406 based on a control signal or bias signal applied to the control terminal 504.

The transistor 406 can be implemented using at least one field-effect transistor (FET), at least one junction FET (JFET), at least one bipolar junction transistor (BJT), at least one insulated-gate bipolar transistor (IGBT), and so forth. Manufacturers may fabricate FETs as n-channel or p-channel transistor types. An FET may be realized as, for example, an n-channel metal-oxide-semiconductor (NMOS) FET (NMOSFET) or a p-channel metal-oxide-semiconductor (PMOS) FET (PMOSFET). Manufacturers may fabricate BJTs as, for example, NPN or PNP transistors.

For a BJT 406-1, the control terminal 504 may be implemented as a base terminal 504 of the BJT. One channel terminal 502 may be implemented as an emitter terminal 502 of the BJT 406-1, and another channel terminal 502 may be implemented as a collector terminal 502 of the BJT 406-1. For an FET 406-2, the control terminal 504 may be implemented as a gate terminal 504 of the FET. One channel terminal 502 may be implemented as a source terminal 502 of the FET 406-2, and another channel terminal 502 may be implemented as a drain terminal 502 of the FET 406-2.

FIG. 5-2 is a schematic diagram 500-2 illustrating example arrangements for connecting a transistor 406 to at least one power distribution node 520. As shown, the control terminal 504 of the transistor 406 can be coupled to or provided a control voltage or bias voltage 522. The first channel terminal 502-1 of the transistor 406 can be coupled to a first power distribution node 520-1. The second channel terminal 502-2 can be coupled to a second power distribution node 520-2. Each power distribution node 520 can correspond to, or be realized using, a voltage rail 524 or a ground 526. The voltage rail 524 may be realized, for example, with a node, a conductive line, a plane, etc., that is held at some voltage level, such as a supply voltage (V.dd).

In example implementations, to couple the transistor 406 between the first and second power distribution nodes 520-1 and 520-2, the first channel terminal 502-1 can be coupled to the voltage rail 524, and the second channel terminal 502-2 can be coupled to the ground 526. Alternatively, the first channel terminal 502-1 can be coupled to the ground 526, and the second channel terminal 502-2 can be coupled to the voltage rail 524. Selection between the voltage rail 524 and the ground 526 can depend, at least partially, on a channel terminal (e.g., source versus drain) and a transistor type (e.g., p-type versus n-type). Although each channel terminal 502 is depicted as being "directly" coupled to a power distribution node 520 in FIG. 5-2, one or more other components (e.g., a resistor or another transistor) may be disposed in between a channel terminal 502 and a power distribution node 520.

Figures 1, 6:
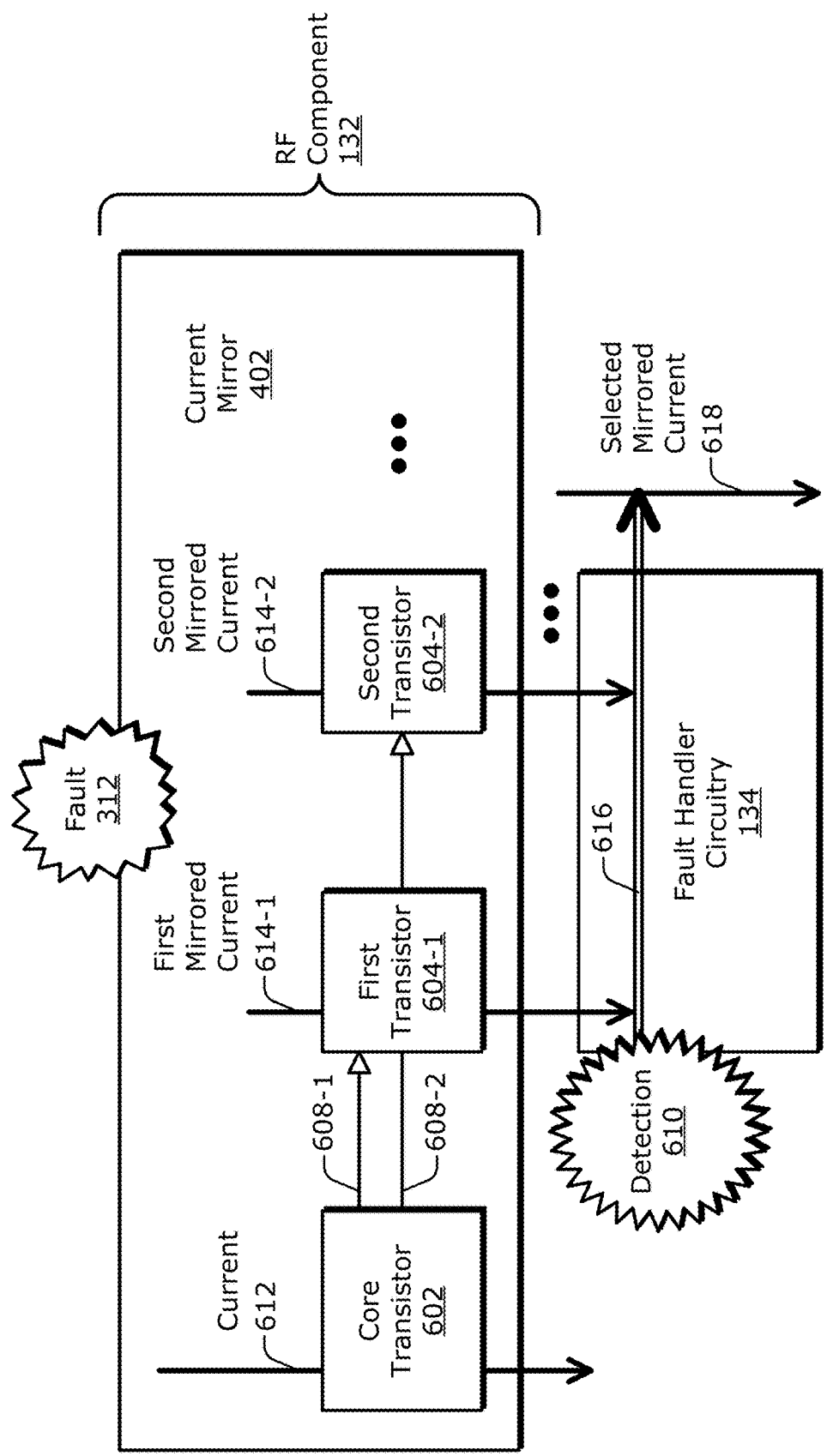
Figures 2, 6:
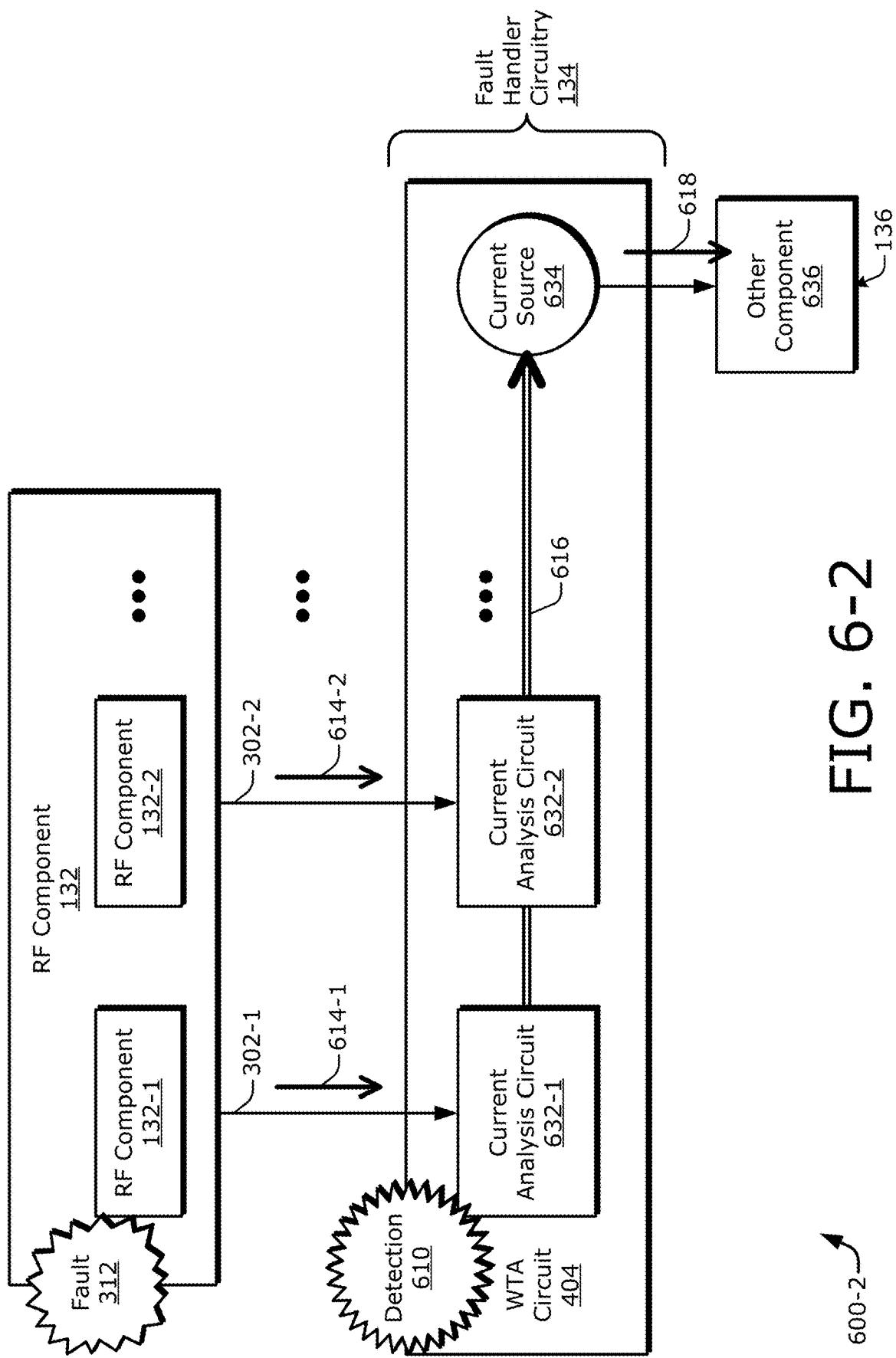

FIG. 6-1 is a schematic diagram 600-1 illustrating an example RF component 132 that is implemented using a current mirror 402 and that is coupled to fault handler circuitry 134. The schematic diagram 600-1 can correspond to the schematic diagram 400-2 of FIG. 4-2. Thus, the current mirror 402 is coupled to the fault handler circuitry 134. The current mirror 402 includes at least a "core" transistor 602, a first transistor 604-1, and a second transistor 604-2, but the current mirror 402 may include more transistors. For example, although two transistors 604-1 and 604-2 are depicted and described herein with respect to FIG. 6, the current mirror 402 can include more than two transistors that mirror current flowing through the core transistor 602.

In example operations, the core transistor 602 provides, or has flowing within it, a current 612 (e.g., a core current 612). The current mirror 402 mirrors the current 612 of the core transistor 602 over to the multiple transistors 604-1 and 604-2 as multiple mirrored currents 614-1 and 614-2 as indicated respectively at mirror operations 608-1 and 608-2. Thus, the first transistor 604-1 produces a first mirrored current 614-1, and the second transistor 604-2 produces a second mirrored current 614-2. A single mirrored current 614 or multiple mirrored currents 614-1 and 614-2 may be flowing at any given time, both before and after a fault 312 of a transistor, depending on implementations.

The fault handler circuitry 134 detects 610 the fault 312 of a given transistor 604 (or of the core transistor 602). Based on the detection 610, the fault handler circuitry 134 performs a current selection operation 616. The fault handler circuitry 134 selects the first mirrored current 614-1 or the second mirrored current 614-2 as a selected mirrored current 618 of the current mirror 402. In some cases, the fault handler circuitry 134 selects, for example, the second mirrored current 614-2 as the selected mirrored current 618 if the first transistor 604-1 experiences the fault 312. For instance, if the first mirrored current 614-1 ceases to meet a target specification (e.g., fails to be above a parameter threshold or stops being within a parameter range), or if the first transistor 604-1 is otherwise not operating within specified parameters, the fault handler circuitry 134 can select the second mirrored current 614-2. Alternatively, the fault handler circuitry 134 can select whichever mirrored current 614 is closest to a target specification or whichever mirrored current 614 has a higher quality or superior value (e.g., the mirrored current 614 with a higher magnitude value).

Thus, in an example scenario for the schematic diagram 600-1, the fault handler circuitry 134 can select the second transistor 604-2 to provide the mirrored current 618 of the current mirror 402 responsive to a fault 312 of the first transistor 604-1. This current selection operation 616 can be performed, for instance, based on the fault handler circuitry 134 detecting the fault 312 of the first transistor 604-1. In some cases, the fault 312 of the first transistor 604-1 can include at least one parameter corresponding to the first transistor 604-1 being outside a range for the at least one parameter. For example, a detected voltage level may be outside a target voltage range.

In other cases, the fault 312 of the first transistor 604-1 can include at least one parameter corresponding to the first transistor 604-1 being lower in quality than at least one parameter corresponding to the second transistor 604-2. In some of these cases, the at least one parameter corresponding to the first transistor 604-1 can comprise a magnitude of a current (e.g., the first mirrored current 614-1) flowing through the first transistor 604-1, and the at least one parameter corresponding to the second transistor 604-2 can comprise a magnitude of a current (e.g., the second mirrored current 614-2) flowing through the second transistor 604-2. With regard to a current parameter, a higher-magnitude current may be superior to a lower-magnitude current in some situations. Thus, in this situation, a current having a (relatively) smaller magnitude has a lower quality than another current having a (relatively) larger magnitude as compared to the smaller magnitude.

Generally, the fault handler circuitry 134 can select a current 614-1 produced by the first transistor 604-1 or a current 614-2 produced by the second transistor 604-2 as the mirrored current (e.g., as the selected mirrored current 618) of the current mirror 402. To perform a current selection operation 616, the fault handler circuitry 134 can select as the mirrored current the current 614-1 that is produced by the first transistor 604-1 or the current 614-2 that is produced by the second transistor 604-2 based on at least one parameter value. The parameter value can be or can relate to a voltage level, a current magnitude, a timing, a noise characteristic, and so forth. For example, the fault handler circuitry 134 can select the mirrored current based on whether the current 614-1 produced by the first transistor 604-1 is greater than or less than the at least one parameter value or whether the current 614-2 produced by the second transistor 604-2 is greater than or less than the at least one parameter value.

Alternatively, to perform a current selection operation 616, the fault handler circuitry 134 can select as the mirrored current the current 614-1 produced by the first transistor 604-1 or the current 614-2 produced by the second transistor 604-2 based on which current has a greater magnitude. In some cases, the current mirror 402 can include a third transistor 604-3 (not explicitly shown) that includes a control terminal that is coupled to the control terminal of the core transistor 602. The fault handler circuitry 134 can select as the mirrored current the current 614-1 produced by the first transistor 604-1, the current 614-2 produced by the second transistor 604-2, or a current 614-3 (not explicitly shown) produced by the third transistor 604-3 based on which current has a greater magnitude between two or more magnitudes (e.g., based on which has a greatest magnitude among three or more current magnitudes). Thus, the fault handler circuitry 134 can select the first transistor 604-1, the second transistor 604-2, or the third transistor 604-3 to provide the mirrored current of a current mirror 402 having at least three transistors (e.g., where "N">=3 for the "N" of FIG. 7).

FIG. 6-2 is a schematic diagram 600-2 illustrating example fault handler circuitry 134 that is implemented using a WTA circuit 404 and that is coupled to at least one radio-frequency component 132. The schematic diagram 600-2 can correspond to the schematic diagram 400-1 of FIG. 4-1. The RF component 132 is thus coupled to the WTA circuit 404. In example implementations, the RF component 132 includes at least the first RF component 132-1 and the second RF component 132-2, but it may include "N" such RF components (e.g., where "N>2"). The RF component 132, the first RF component 132-1, and/or the second RF component 132-2 can comprise, for example, any component or portion thereof that is described herein as being present in the RF section 130 (e.g., of FIGS. 1 and 2).

The WTA circuit 404 includes multiple current analysis circuits 632-1 and 632-2: a first current analysis circuit 632-1 and a second current analysis circuit 632-2. Although only two current analysis circuits are explicitly shown in FIG. 6-2, a WTA circuit 404 may include "N" such current analysis circuits, with "N" representing a positive integer such as three or four. Each current analysis circuit 632 may include at least two transistors; examples of a current analysis circuit 632 are described below with reference to FIGS. 7 and 8.

The WTA circuit 404 can also include a current source 634; examples of a current source 634 are described below with reference to FIGS. 7 and 8. Alternatively, the current source 634 may be omitted or may be included separately from the WTA circuit 404. The current source 634 can be coupled to another component 636, which may serve as the load 136. The current source 634 can apply the selected current 618 to the other component 636 in accordance with the current selection operation 616. As described below, the current selection operation 616 can entail a mirroring of a greater (e.g., including a greatest) current from at least one of the first current analysis circuit 632-1 or the second current analysis circuit 632-2.

Each current analysis circuit 632 can be coupled to the current source 634. Each current analysis circuit 632 can also be coupled to the at least one RF component 132. The WTA 404 can therefore receive the first and second signals 302-1 and 302-2, which may include or correspond to the first and second currents 614-1 and 614-2. In some cases, the first current analysis circuit 632-1 is coupled to the first RF component 132-1, and the second current analysis circuit 632-2 is coupled to the second RF component 132-2. In some such cases, the first current analysis circuit 632-1 can receive the first current 614-1 from the first RF component 132-1, and the second current analysis circuit 632-2 can receive the second current 614-2 from the second RF component 132-2. As represented by the first and second signals 302-1 and 302-2, at least one RF component 132 (e.g., the first RF component 132-1) can be coupled to the first current analysis circuit 632-1 via a first electrical path (not separately or explicitly shown in FIG. 6-2), and the at least one RF component 132 (e.g., the second RF component 132-2) can be coupled to the second current analysis circuit 632-2 via a second electrical path (not separately or explicitly shown in FIG. 6-2).

In example operations, at least one radio-frequency component 132 can produce multiple currents, such as the first current 614-1 and the second current 614-2. The winner-take-all (WTA) circuit 404 is coupled to the at least one radio-frequency component 132. The WTA can select a current of the multiple currents and apply the current (e.g., apply the selected current from between the first current 614-1 and the second current 614-2) to another component (e.g., the other component 636) as the selected current 618. In some cases, the other component 636 is realized with another radio-frequency component, and the WTA circuit 404 can therefore apply the current 618 to the other radio-frequency component.

Of the multiple current analysis circuits (e.g., at least the first and second current analysis circuits 632-1 and 632-2), each respective current analysis circuit 632 can receive a corresponding current of the multiple currents 614-1 and 614-2. Each respective current analysis circuit 632 can then produce a respective current (not shown in FIG. 6-2) based on the corresponding current that is received. Each respective current of the respective current analysis circuit 632 may have a magnitude that is dependent, at least partly, on the corresponding current that is received. Thus, a larger corresponding received current can result in a larger respective current at the respective current analysis circuit 632. Further, the current source 634 can sink or source (e.g., source as depicted) the current 618 with respect to the other component 636. The WTA circuit 404 can mirror the respective current having at least a greater magnitude (e.g., including a greatest magnitude) from a respective current analysis circuit 632 to the current source 634 as the current 618 as part of the current selection operation 616.

In some implementations, the at least one radio-frequency component 132 can include a first radio-frequency component 132-1 and a second radio-frequency component 132-2 as shown. The multiple currents 614-1 and 614-2 can represent currents that are present during one or more calibration modes. Additionally or alternatively, the multiple currents 614-1 and 614-2 can represent currents that are present during one or more mission modes, or normal operational modes for a user. Accordingly, the first current 614-1 and the second current 614-2 may respectively correspond to a first operational current of the first radio-frequency component 132-1 and a second operational current of the second radio-frequency component 132-2.

In some cases, the first radio-frequency component 132-1 can include a first portion of a phase-locked loop (PLL) (e.g., a PLL 250 of FIG. 2), and the second radio-frequency component 132-2 can include a second portion of the phase-locked loop. To provide redundancy, the second portion may correspond to a replica of the first portion. The other component 636 may include a third portion of the phase-locked loop that receives an input that is output by an operational and/or superior signal source selected between at least the first and second portions of the phase-locked loop.

In other cases, the first radio-frequency component 132-1 can include a first power management integrated circuit (PMIC) (e.g., a PMIC 240 of FIG. 2) that can supply power to at least part of a radio-frequency section 130 of a wireless interface device 120. The second radio-frequency component 132-2 can include a second power management integrated circuit that can supply power to the at least part of the radio-frequency section 130 of the wireless interface device 120. In operation, the WTA circuit 404 can select between the first and second PMICs for supplying regulated and/or reliable power to the RF section 130.

Although described with reference to FIG. 6-2 in terms of detecting a fault 312 in an RF component 132, a WTA circuit 404 can also or instead be used to detect a fault 312 in a NRF component and/or in component of a NRF section 230 (of FIG. 2). Further, although the WTA circuit 404 of FIG. 6-2 is described in terms of operating on currents, a WTA circuit 404 can alternatively operate on voltages. In other words, a WTA circuit 404 can be current-based or voltage based.

Figure 7:
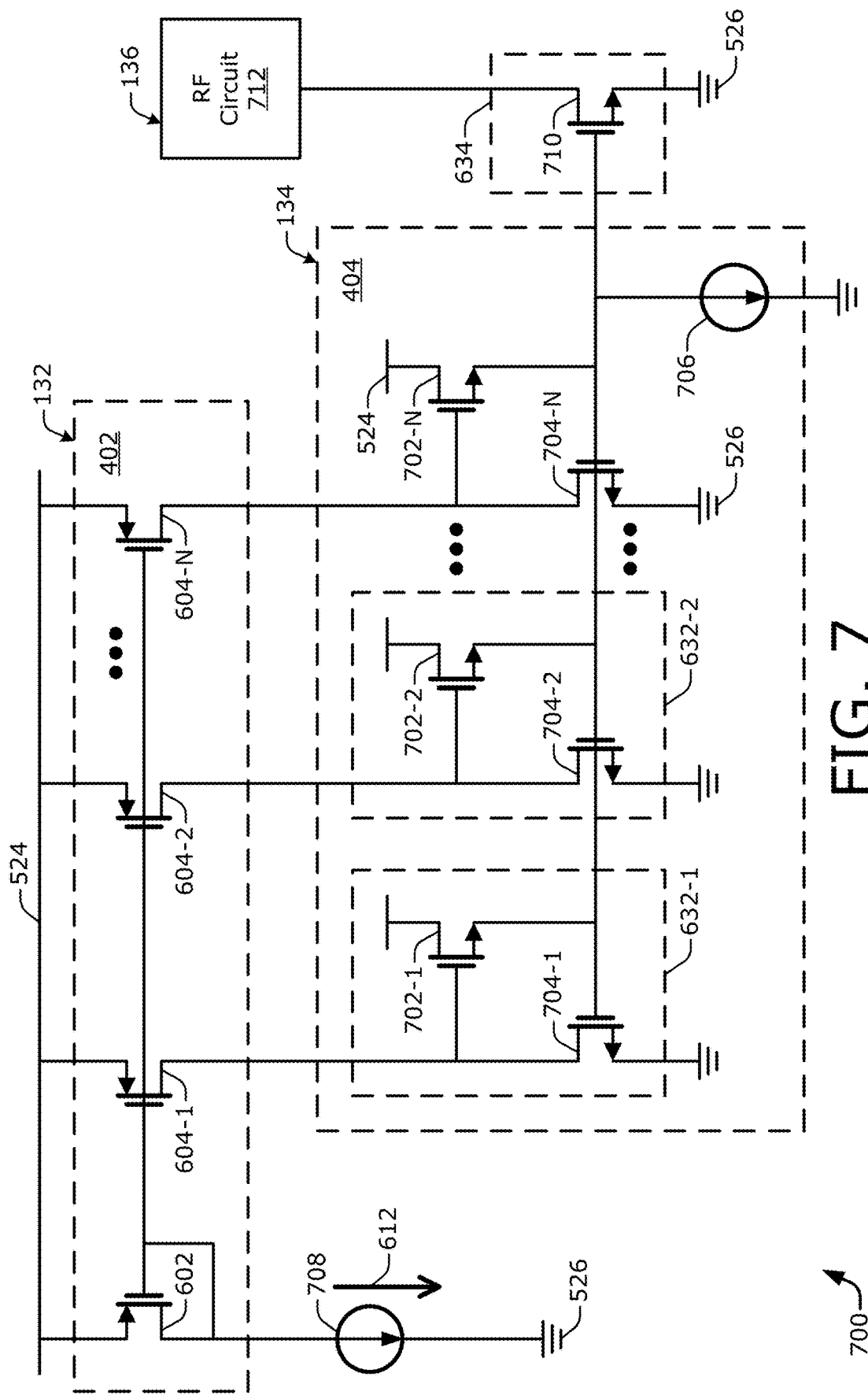
FIG. 7 is a circuit diagram illustrating an example RF component that is implemented with a current mirror and example fault handler circuitry that is implemented with a WTA circuit.

FIG. 7 is a circuit diagram 700 illustrating an example RF component 132 that is implemented with a current mirror 402 and example fault handler circuitry 134 that is implemented with a winner-take-all (WTA) circuit 404. The example circuit diagram 700 also includes an example load 136 that is implemented with an RF circuit 712. The circuit diagram 700 can also include or have access to at least one current source 708, at least one transistor 710, at least one voltage rail 524, and at least one ground 526 (e.g., a ground node, line, or plane). The transistor 710 can be coupled between the RF circuit 712 and the ground 526 to act as a current sink with respect to the load 136. Although the transistor 710 is depicted separately from the WTA circuit 404, the WTA circuit 404 can instead include the transistor 710.

In example implementations, the current mirror 402 includes a core transistor 602 and multiple other transistors 604-1, 604-2, ..., 604-N, with "N" representing a positive integer of two or greater. Thus, the current mirror 402 can include a first transistor 604-1, a second transistor 604-2, a third transistor 604-3 (not explicitly shown), ..., an "Nth" transistor 604-N. The core transistor 602 and the multiple transistors 604-1 ... 604-N are illustrated as p-type FETs (PFETs) and are coupled more closely to the voltage rail 524 than to the ground 526. These transistors may, however, be implemented with n-type FETs (NFETs) and be coupled closer to the ground 526 than the voltage rail 524. The core transistor 602 and the multiple transistors 604-1, 604-2, ..., 604-N may also be implemented with a different type of transistor, such as a BJT.

The core transistor 602 is implemented in a diode-connected configuration in which the control terminal thereof (e.g., the gate terminal of the FET) is coupled to a channel terminal thereof (e.g., the drain terminal of the FET). To form the current mirror 402, the control terminal of the first transistor 604-1 is coupled to the control terminal of the core transistor 602. The control terminal of the second transistor 604-2 is coupled to the control terminal of the core transistor 602. The control terminal of a third transistor 604-3 (not explicitly shown) is also coupled to the control terminal of the core transistor 602. Further, the control terminal of the "Nth" transistor 604-N is coupled to the control terminal of the core transistor 602. To establish a current in the core transistor 602, the current source 708 is coupled between the core transistor 602 and a power distribution node, which is the ground 526 in the circuit diagram 700.

In example operations, the current mirror 402 mirrors the current 612 flowing through the core transistor 602 as a current (e.g., the first mirrored current 614-1) flowing through the first transistor 604-1. The current mirror 402 mirrors the current 612 flowing through the core transistor 602 also as a current (e.g., the second mirrored current 614-2) flowing through the second transistor 604-2. The current mirror 402 can further mirror the current 612 flowing through the core transistor 602 as another current flowing through any additional transistors 604-x of the current mirror 402, such as the third transistor 604-3 or the "Nth" transistor 604-N.

The fault handler circuitry 134 can select the first transistor 604-1 or the second transistor 604-2 to provide a mirrored current (e.g., as the selected mirrored current 618 of FIGS. 6-1 and 8) of the current mirror 402. In the circuitry of FIG. 7, the fault handler circuitry 134 is realized using the WTA circuit 404. The WTA circuit 404 can detect a particular current having at least a greater magnitude from a current flowing through the first transistor 604-1 and a current flowing through the second transistor 604-2. The WTA circuit 404 can then provide the particular current as the mirrored current at the transistor 710. Example current flows are described further below with reference to FIG. 8.

In example WTA circuit implementations, the WTA circuit 404 includes a first set of multiple transistors 704-1, 704-2, ..., 704-N and a second set of multiple transistors 702-1, 702-2, ..., 702-N, with "N" representing a positive integer greater than one. Each respective transistor 704 of the first set of multiple transistors 704-1, 704-2, ..., 704-N is coupled to a respective transistor 604 of the multiple transistors 604-1, 604-2, ..., 604-N of the current mirror 402 via channel terminals to enable a respective current to flow through the respective transistor 604 and the respective transistor 704. The respective control terminals (e.g., gate terminals of the example FETs) of respective ones of the first set of multiple transistors 704-1, 704-2, ..., 704-N are coupled together and to a control terminal (e.g., a gate terminal) of the transistor 710.

A respective transistor 702 of the second set of multiple transistors 702-1, 702-2, ..., 702-N is coupled across two terminals of a respective transistor 704 of the first set of multiple transistors 704-1, 704-2, ..., 704-N between respective control and channel (e.g., between gate and drain) terminals. Each respective pair of transistors 702 and 704 can form a respective current analysis circuit 632 (also of FIG. 6-2). The first current analysis circuit 632-1 includes a first transistor 704-1 and a third transistor 702-1. The second current analysis circuit 632-2 includes a second transistor 704-2 and a fourth transistor 702-2.

If a respective transistor 702 is turned on, this circuit arrangement enables the respective transistor 704 to be connected in a diode configuration. Further, while in a diode-connected configuration, the respective transistor 704 and the transistor 710 form another current mirror that mirrors current from the transistor 704 over to the transistor 710. The transistor 710 can form at least part of the current source 634 (also of FIG. 6-2). The first set of multiple transistors 704-1, 704-2, . . . , 704-N and the second set of multiple transistors 702-1, 702-2, . . . , 702-N are illustrated as NFETs. These transistors may, however, be implemented with PFETs or another transistor type. As shown, the WTA circuit 404 may also include a current source 706 that is coupled between a power distribution node (e.g., the ground 526 in the depicted example) and the control (e.g., gate) terminals of the first set of multiple transistors 704-1, 704-2, . . . , 704-N.

In some implementations, a first transistor 704-1 of the WTA circuit 404 includes a channel terminal (e.g., a drain terminal) coupled to a channel terminal (e.g., a drain terminal) of the first transistor 604-1 of the current mirror 402. A second transistor 704-2 of the WTA circuit 404 has a channel terminal coupled to a channel terminal of the second transistor 604-2 of the current mirror 402. A third transistor 702-1 of the WTA circuit 404 is coupled between the channel terminal (e.g., the drain terminal) of the first transistor 704-1 and a control terminal (e.g., a gate terminal) of the first transistor 704-1. A fourth transistor 702-2 of the WTA circuit 404 is coupled between the channel terminal of the second transistor 704-2 and a control terminal of the second transistor 704-2.

During operation, the WTA circuit 404 can mirror a current from at least one transistor 704 over to the transistor 710. To do so, the control terminal of the first transistor 704-1 of the WTA circuit 404, the control terminal of the second transistor 704-2 of the WTA circuit 404, and the control terminal of the transistor 710 can be coupled together. In this configuration, the WTA circuit 404 can provide the mirrored current using the control terminal of the first transistor 704-1 and the control terminal of the second transistor 704-2 of the WTA circuit 404. Which control terminal of which transistor 704 establishes the mirrored current in the transistor 710 is described below with reference to FIG. 8.

The second set of multiple transistors 702-1, 702-2, . . . , 702-N are arranged to turn on the first set of multiple transistors 704-1, 704-2, . . . , 704-N to varying degrees or at different times based on the multiple transistors 604-1, 604-2, 604-N of the current mirror 402. To turn on by varying amounts the first two transistors of the first set of multiple transistors 704-1, 704-2, . . . , 704-N, the third and fourth transistors 702-1 and 702-2 of the WTA circuit 404 can be connected as follows. A control terminal (e.g., a gate terminal) of the third transistor 702-1 is coupled to the channel terminal (e.g., the drain terminal) of the first transistor 704-1 of the WTA circuit 404. A first channel terminal (e.g., a source terminal) of the third transistor 702-1 is coupled to the control terminal (e.g., the gate terminal) of the first transistor 704-1. A second channel terminal (e.g., a drain terminal) of the third transistor 702-1 is coupled to a power distribution node, which is a voltage rail 524 in this example.

A control terminal (e.g., a gate terminal) of the fourth transistor 702-2 is coupled to the channel terminal (e.g., the drain terminal) of the second transistor 704-2 of the WTA circuit 404. A first channel terminal (e.g., the source terminal) of the fourth transistor 702-2 is coupled to the control terminal (e.g., the gate terminal) of the second transistor 704-2. A second channel terminal (e.g., a drain terminal) of the fourth transistor 702-2 is coupled to the voltage rail 524. The "Nth" transistor 704-N may also be turned on by varying amounts using the "Nth" transistor 702-N.

Figure 8:
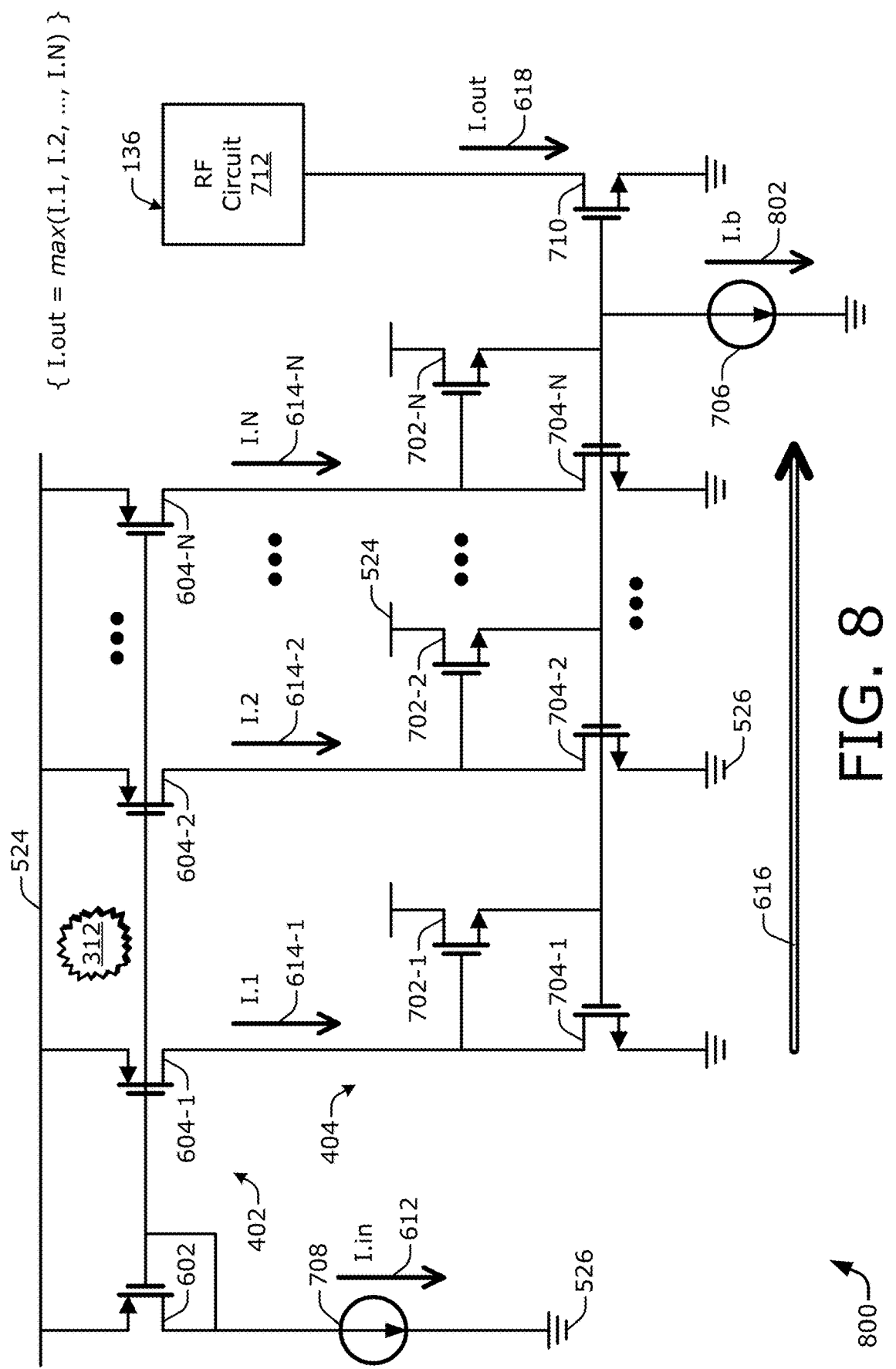
FIG. 8 is a circuit diagram illustrating example current flows and operations of a current mirror and associated WTA circuitry as depicted in FIG. 7.

FIG. 8 is a circuit diagram 800 illustrating example operations and current flows of a current mirror 402 and associated WTA circuitry 404 as depicted in FIG. 7. In example implementations, the current source 708 establishes the current 612 (I.in) that flows through the core transistor 602 of the current mirror 402. Based on current mirroring operations, the core transistor 602 attempts to mirror the current 612 (or core current 612) over to the multiple transistors 604-1, 604-2, . . . , 604-N of the current mirror 402. Accordingly, the first transistor 604-1 provides a first current 614-1 (I.1). The second transistor 604-2 provides a second current 614-2 (I.2). A third transistor 604-3 (not explicitly shown) provides a third current 614-3 (I.3) (not explicitly shown). And the "Nth" transistor 604-N provides an "Nth" current 614-N (I.N).

If each transistor 604 is operating correctly (e.g., within target specifications), each of the first, second, third, . . . , "Nth" currents 614-1, 614-2, 614-3, . . . , 614-N are approximately the same—e.g., have a same magnitude within 5-10% of each other. In some cases, however, a defect eventually becomes sufficiently impactful to appreciably reduce the flow of a current 614 in a transistor 604, including potentially turning off the transistor 604. This condition is referred to herein as a fault 312. With the redundancy of having multiple transistors 604-1 . . . 604-N in the current mirror 402, and by operation of the WTA circuit 404, the circuitry of FIG. 8 can at least partially compensate for and/or overcome the fault 312.

In example operations of the circuit diagram 800, the WTA circuit 404 performs a current selection operation 616. The WTA circuit 404 has a bias current 802 (I.b) that is sunk by the current source 706 to enable the second set of multiple transistors 702-1, 702-2, . . . , 702-N to propagate current. When a respective transistor 702 is turned on, the corresponding transistor 704 is placed in a diode-connected configuration that can mirror its respective current over to the transistor 710 as the selected mirrored current 618 (I.out). With the WTA circuit 404, the transistor 704 that is turned on faster and/or more can establish or control the selected mirrored current 618 flowing through the transistor 710 (e.g., the output transistor 710).

Consider a situation in which the first current 614-1 (I.1) is negligible or at least appreciably lower than the second current 614-2 (I.2). The circuitry routes the first current 614-1 from the transistor 604-1 toward the transistor 704-1 and routes the second current 614-2 from the transistor 604-2 toward the transistor 704-2. During an initial or non-steady-state phase, the second current 614-2 (I.2) builds up charge on the control terminal of the fourth transistor 702-2 of the WTA circuit 404 faster than the first current 614-1 (I.1) builds up charge on the control terminal of the third transistor 702-1 of the WTA circuit 404. Consequently, the fourth transistor 702-2 turns on before the third transistor 702-1. This causes current to flow through the fourth transistor 702-2 via a power distribution node 520 (e.g., the voltage rail 524 in this example).

The current flowing through the fourth transistor 702-2 increases the charge level on the control terminal of the second transistor 704-2 of the WTA circuit 404. As the gate-to-source voltage (V.GS) increases, the second transistor 704-2 eventually turns on. Further, the second transistor 704-2 turns on sooner and/or stronger than the first transistor 704-1 of the WTA circuit 404, which transistor is receiving the first current 614-1 (I.1) having a lower magnitude than the second current 614-2 (I.2). Consequently, the second transistor 704-2 controls the current flowing through the transistor 710 (e.g., at least a fifth transistor of the WTA circuit 404). In other words, the selected mirrored current 618 (or output current 618 (I.out)) is approximately equal to the second current 614-2 (I.2) because the second current 614-2 (I.2) is larger than the first current 614-1 (I.1).

The WTA circuit 404, therefore, implicitly detects the magnitude of each current 614 of the multiple currents 614-1 ... 614-N and compares the multiple magnitudes to determine which is the larger current (including largest current if more than two). The WTA circuit 404 also selects this largest current 614 and applies it to the RF circuit 712 as the selected mirrored current 618 using the output transistor 710. Accordingly, the WTA circuit 404 can implement (e.g., realize or perform the functions of) a parameter detection circuit 306, a parameter comparison circuit 308, and a signal selection circuit 310 (e.g., of FIG. 3) as described herein. Although shown as a current sink in FIG. 8, the output transistor 710 may instead be employed as a current source with respect to the load 136, as is shown in FIG. 6-2.

The WTA circuit 404 ensures that the selected mirrored current 618 (or output current (I.out)) has a magnitude that is substantially equivalent to a maximum current of the multiple currents 614-1, 614-2, ..., 614-N {I.out=max(I.1, I.2, ..., I.N)}. In these manners, the WTA circuit 404 can operate as fault handler circuitry 134 for the current mirror 402 to remedy, or at least ameliorate, a situation in which a transistor 604 of the current mirror 402 has a fault 312 that reduces current flow. Although the WTA circuit of FIGS. 7 and 8 is described in terms of operating on currents (e.g., the multiple currents 614-1, 614-2, ..., 614-N), a WTA circuit can alternatively operate on voltages. In other words, a WTA circuit can be current-based or voltage based.

Figure 9:
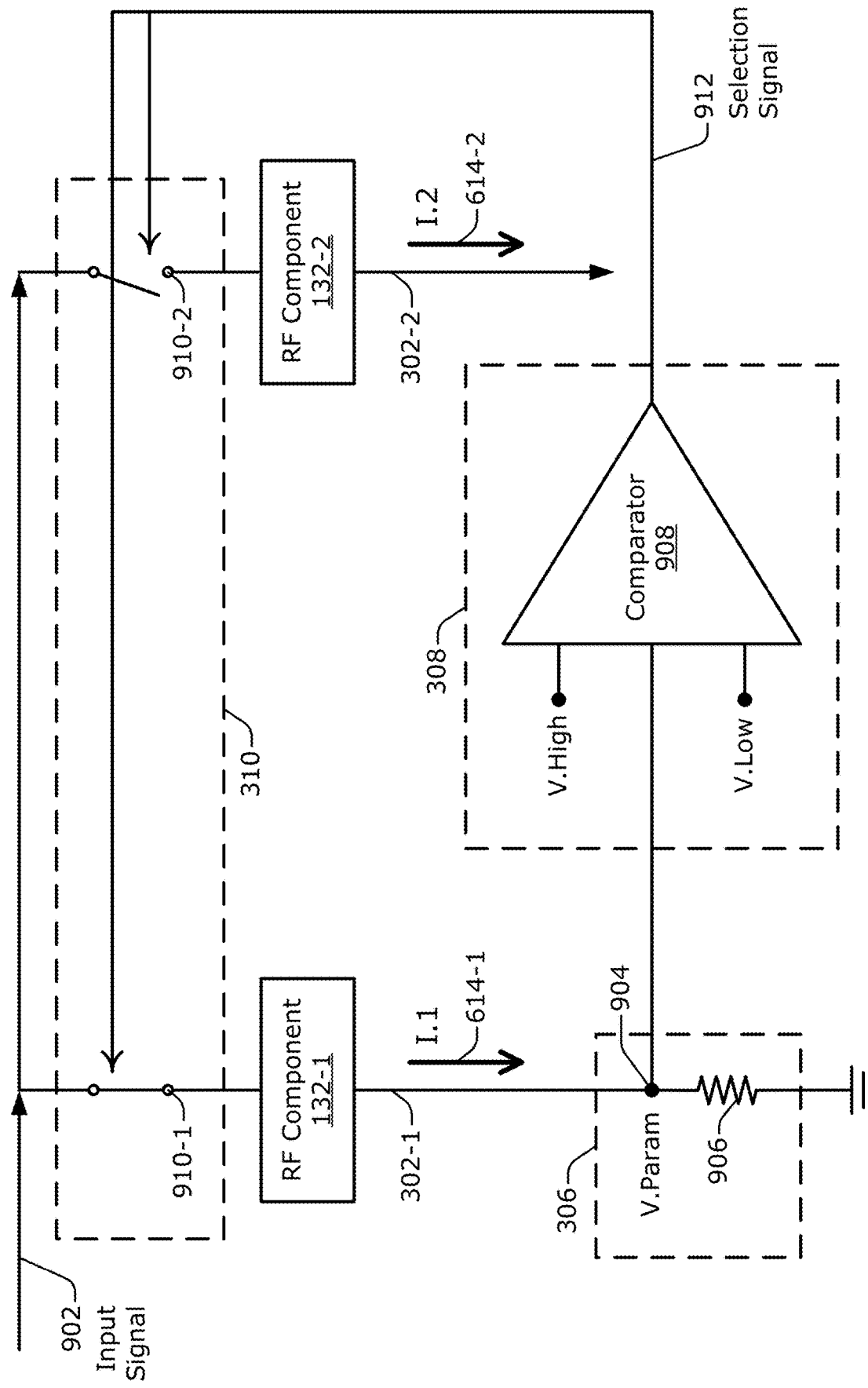
FIG. 9 is a circuit diagram illustrating multiple RF components and example fault handler circuitry that is implemented with at least one comparator.

FIG. 9 is a circuit diagram 900 illustrating multiple radio-frequency components 132-1 and 132-2 and example fault handler circuitry 134 (e.g., of FIG. 3) that is implemented with at least one comparator 908. The first and second RF components 132-1 and 132-2 can correspond to any RF component as described above, including those with references to FIGS. 1 and 2. Examples of such RF components 132 include at least part of a PMIC 240, at least part of a PLL 250, at least one transistor, a component in the RF section 130, and so forth. In operation, the first RF component 132-1 produces a first signal 302-1 (e.g., a first current 614-1), and the second RF component 132-2 produces a second signal 302-2 (e.g., a second current 614-2).

In example implementations, the fault handler circuitry 134 (e.g., of FIG. 3) includes at least one parameter detection circuit 306, at least one parameter comparison circuit 308, and at least one signal selection circuit 310. The parameter detection circuit 306 can include at least one resistor 906 to produce a voltage parameter 904 (V.Param) based on the first current 614-1. The parameter comparison circuit 308 can include at least one comparator 908 to compare the voltage parameter 904 (V.Param) to at least one target value, such as a high voltage level (V.High) or a low voltage level (V.Low). The signal selection circuit 310 can include multiple switches 910-1 and 910-2. A first switch 910-1 is coupled to the first RF component 132-1, and a second switch 910-2 is coupled to the second RF component 132-2.

In example operations, the first and second switches 910-1 and 910-2 enable or disable access to an input signal 902 for the first and second RF components 132-1 and 132-2, respectively. With the first switch 910-1 in a closed state and the second switch 910-2 in an open state, the first RF component 132-1 has access to the input signal 902, but the second RF component 132-2 does not. The first RF component 132-1 produces the first signal 302-1 based on the input signal 902. In this example, the first signal 302-1 includes or is otherwise associated with a first current 614-1. The parameter detection circuit 306 can route (e.g., drop) the first current 614-1 into the resistor 906 to obtain the voltage parameter 904 (V.Param). More generally, the parameter detection circuit 306 is directing the first current 614-1 through a component (e.g., the resistor 906) to produce a voltage (e.g., the voltage parameter 904).

The parameter comparison circuit 308 can use the at least one comparator 908 to determine if the voltage parameter 904 (V.Param) is within a target voltage range, which is between the high voltage level (V.High) and the low voltage level (V.Low) in this example. If so, a selection signal 912 can maintain the current states of the first and second switches 910-1 and 910-2. If, on the other hand, the voltage parameter 904 (V.Param) is not between the high voltage level (V.High) and the low voltage level (V.Low), the comparator 908 can adjust the selection signal 912. The adjusted selection signal 912 can change at least one state of the switches of the signal selection circuit 310. For instance, the adjusted selection signal 912 can open the first switch 910-1 and close the second switch 910-2 to deactivate the first RF component 132-1 and to activate the second RF component 132-2.

The circuitry of FIG. 9 can be implemented in many alternative manners. In one example alternative, each of the first and second RF components 132-1 and 132-2 can receive the input signal 902. The selection signal 912 can instead select which signal 302-1 or 302-2 is provided to the load 136 (not shown in FIG. 9). In this alternative, the first and second switches 910-1 and 910-2 can gate access to, or propagation of, the first and second signals 302-1 and 302-2, respectively. In another alternative, the signal selection can be based on which of the two signals 302-1 and 302-2 has a superior quality, which can be determined by the parameter comparison circuit 308. Thus, the at least one comparator 908 can compare the first signal 302-1 to the second signal 302-2 in some alternative implementations. Additionally, based on the circuit 900 as depicted, the at least one comparator 908 may compare the voltage parameter 904 (V.Param) to a single reference value to determine if the voltage parameter 904 is above or below the single reference value. As another alternative, the parameter detection circuit 306 may detect another aspect of the signal 302-1 or another aspect of the operation or functionality of the first RF component 132-1, such as a frequency, a speed of response, a noise level, and so forth.

Generally, the parameter detection circuit 306 can detect multiple currents. For example, detecting can include directing the first current 614-1 through a first component (e.g., a first resistor) to produce a first voltage (e.g., a first voltage parameter) and directing the second current 614-2 through a second component (e.g., a second resistor) to produce a second voltage (e.g., a second voltage parameter). The parameter comparison circuit 308 can use at least one comparator 908 for comparing the first voltage and the second voltage. When two or more currents are detected as voltages and compared, the signal selection circuit 310 can select the first current 614-1 or the second current 614-2 as the selected current (e.g., as the mirrored current) based on the comparison. For instance, the larger current can be selected as the mirrored current.

Figure 10:
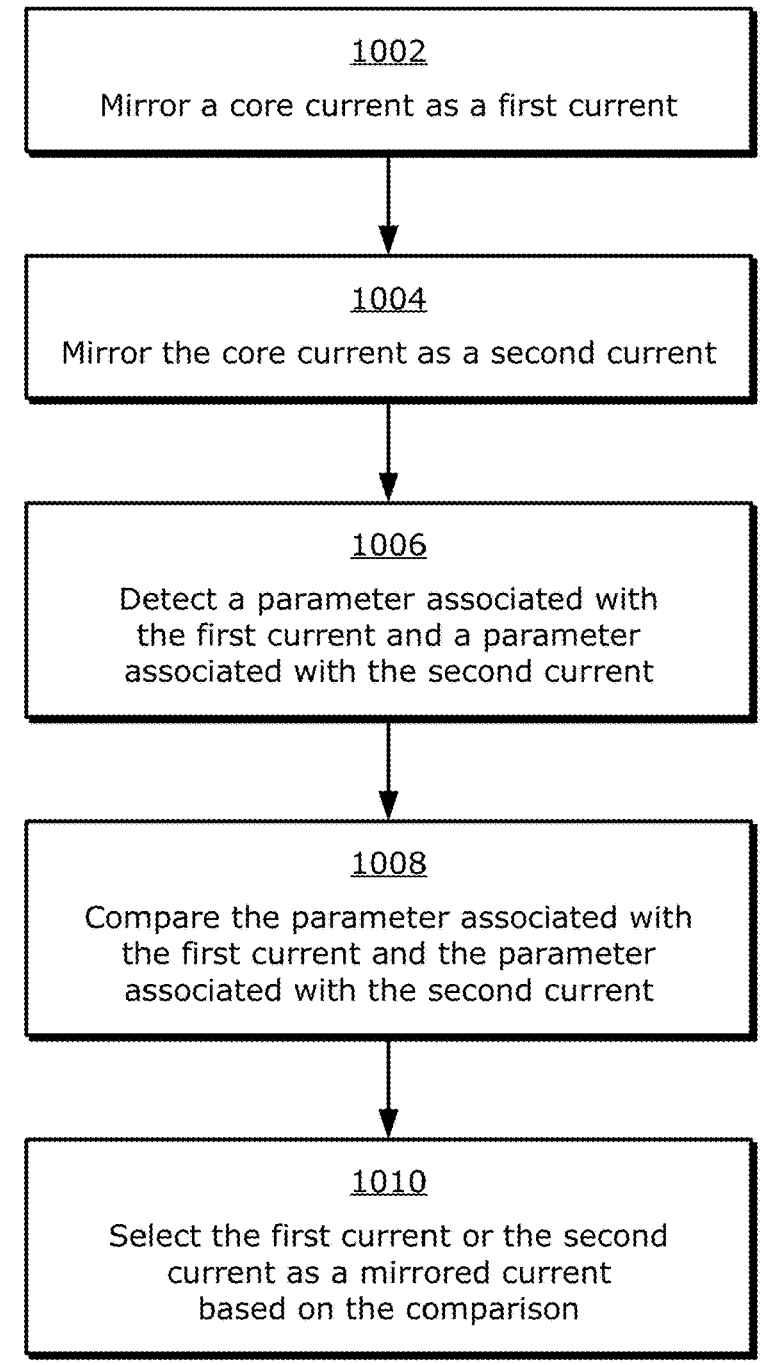
FIG. 10 is a flow diagram illustrating an example process for operating robust transistor circuitry.

FIG. 10 is a flow diagram illustrating an example process 1000 for operating robust transistor circuitry. The process 1000 is described in the form of a set of blocks 1002-1010 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000 or an alternative process. Operations represented by the illustrated blocks of the process 1000 may be performed by an electronic device, such as the electronic device 102 of FIG. 1 or the wireless interface device 120 thereof. More specifically, the operations of the process 1000 may be performed by at least one RF component 132 and associated fault handler circuitry 134 (e.g., of FIGS. 1 to 6-2). The process 1000 may, therefore, be performed in a radio-frequency section 130 of the wireless interface device 120.

At block 1002, an RF component 132 is mirroring a core current as a first current. For example, a current mirror 402 instantiation of the RF component 132 can mirror a core current 612 as a first current 614-1. For instance, a diode-connected core transistor 602 may replicate the core current 612 as the first current 614-1 in a first transistor 604-1 of the current mirror 402.

At block 1004, the RF component 132 is mirroring the core current as a second current. For example, the current mirror 402 can mirror the core current 612 as a second current 614-2. For instance, the diode-connected core transistor 602 may replicate the core current 612 as the second current 614-2 in a second transistor 604-2 of the current mirror 402.

At block 1006, fault handler circuitry 134 is detecting a parameter associated with the first current and a parameter associated with the second current. For example, a parameter detection circuit 306 can detect a parameter associated with the first current 614-1 and a parameter associated with the second current 614-2. In some cases, the parameter may correspond to a magnitude of the current. In a first approach, the parameter detection circuit 306 may route the currents through respective resistors (e.g., two resistors 906) to obtain respective voltage levels (e.g., two voltage parameters 904) that can represent the magnitudes of the two currents. In a second approach, the parameter detection circuit 306 aspect of a WTA circuit 404 may route the currents to current analysis circuits 632-1 and 632-2 where a degree to which a transistor is turned on can represent the magnitudes of the two currents.

At block 1008, the fault handler circuitry 134 is comparing the parameter associated with the first current and the parameter associated with the second current. For example, a parameter comparison circuit 308 can compare the parameter associated with the first current 614-1 and the parameter associated with the second current 614-2. In the first approach, the parameter comparison circuit 308 may use at least one comparator 908 to determine which voltage level is greater. In the second approach, the parameter comparison circuit 308 aspect of the WTA circuit 404 may establish competing current mirror circuitries using the first and second current analysis circuits 632-1 and 632-2.

At block 1010, the fault handler circuitry 134 is selecting the first current or the second current as a mirrored current based on the comparing. For example, a signal selection circuit 310 can select the first current 614-1 or the second current 614-2 as a mirrored current 618 based on the comparison of the block 1008. In the first approach, the signal selection circuit 310 may change, based on an output of the at least one comparator 908, a state of at least one switch 910 to enable or deactivate an RF component 132-1 or 132-2 or to gate at least one signal 302-1 or 302-2 to thereby select a current 614-1 or 614-2 as the output current 618. In the second approach, the signal selection circuit 310 aspect of the WTA circuit 404 may mirror over the stronger of the first and second currents 614-1 or 614-2 to the transistor 710 as the output current 618.

In some implementations, the process 1000 can further include applying the mirrored current 618 to a load 136 (e.g., of FIGS. 6-2, 7, and 8) in a radio-frequency section 130 of a wireless interface device 120. Additionally or alternatively, the operations of the blocks 1006, 1008, and/or 1010 (e.g., the detecting, the comparing, and the selecting, respectively) may be performed, at least partially, by the winner-take-all (WTA) circuit 404, which is described above with reference to the second approach.

This section describes some aspects of example implementations and/or example configurations related to the apparatuses and/or processes presented above.

Example aspect 1: An apparatus comprising:
a current mirror comprising:
a core transistor comprising a control terminal;
a first transistor comprising a control terminal coupled to the control terminal of the core transistor; and
a second transistor comprising a control terminal coupled to the control terminal of the core transistor; and
fault handler circuitry coupled to the current mirror, the fault handler circuitry configured to select the first transistor or the second transistor to provide a mirrored current of the current mirror.

Example aspect 2: The apparatus of example aspect 1, wherein the fault handler circuitry comprises a winner-take-all (WTA) circuit.

Example aspect 3: The apparatus of example aspect 2, wherein the WTA circuit is configured to:
detect a particular current having a greater magnitude of a current flowing through the first transistor and a current flowing through the second transistor; and
provide the particular current as the mirrored current.

Example aspect 4: The apparatus of example aspect 2 or example aspect 3, wherein the WTA circuit comprises:
a first transistor having a channel terminal coupled to a channel terminal of the first transistor of the current mirror;
a second transistor having a channel terminal coupled to a channel terminal of the second transistor of the current mirror;
a third transistor coupled between the channel terminal of the first transistor of the WTA circuit and a control terminal of the first transistor of the WTA circuit; and
a fourth transistor coupled between the channel terminal of the second transistor of the WTA circuit and a control terminal of the second transistor of the WTA circuit.

Example aspect 5: The apparatus of example aspect 4, wherein:
the control terminal of the first transistor of the WTA circuit is coupled to the control terminal of the second transistor of the WTA circuit; and
the WTA circuit is configured to control the mirrored current using at least one of the control terminal of the first transistor of the WTA circuit or the control terminal of the second transistor of the WTA circuit.

Example aspect 6: The apparatus of example aspect 4 or example aspect 5, wherein:
the third transistor comprises:
a control terminal coupled to the channel terminal of the first transistor of the WTA circuit;
a first channel terminal coupled to the control terminal of the first transistor of the WTA circuit; and
a second channel terminal coupled to a power distribution node; and the fourth transistor comprises:
a control terminal coupled to the channel terminal of the second transistor of the WTA circuit;
a first channel terminal coupled to the control terminal of the second transistor of the WTA circuit; and
a second channel terminal coupled to the power distribution node.

Example aspect 7: The apparatus of any one of example aspects 4-6, wherein the WTA circuit comprises:
a current source coupled between the control terminal of the first transistor of the WTA circuit and a power distribution node.

Example aspect 8: The apparatus of any one of the preceding example aspects, wherein the fault handler circuitry is configured to select the second transistor to provide the mirrored current of the current mirror responsive to a fault of the first transistor.

Example aspect 9: The apparatus of example aspect 8, wherein the fault handler circuitry is configured to detect the fault of the first transistor.

Example aspect 10: The apparatus of example aspect 9, wherein the fault of the first transistor comprises at least one parameter corresponding to the first transistor being outside a range for the at least one parameter.

Example aspect 11: The apparatus of example aspect 9 or example aspect 10, wherein the fault of the first transistor comprises at least one parameter corresponding to the first transistor being lower in quality than at least one parameter corresponding to the second transistor.

Example aspect 12: The apparatus of example aspect 11, wherein:
the at least one parameter corresponding to the first transistor comprises a magnitude of a current flowing through the first transistor; and
the at least one parameter corresponding to the second transistor comprises a magnitude of a current flowing through the second transistor.

Example aspect 13: The apparatus of example aspect 12, wherein a current having a smaller magnitude has a lower quality than another current having a larger magnitude compared to the smaller magnitude.

Example aspect 14: The apparatus of any one of the preceding example aspects, wherein the fault handler circuitry is configured to select a current produced by the first transistor or a current produced by the second transistor as the mirrored current of the current mirror.

Example aspect 15: The apparatus of example aspect 14, wherein the fault handler circuitry is configured to select as the mirrored current the current produced by the first transistor or the current produced by the second transistor based on at least one parameter value.

Example aspect 16: The apparatus of example aspect 15, wherein the fault handler circuitry is configured to select as the mirrored current the current produced by the first transistor or the current produced by the second transistor based on at least one of:
whether the current produced by the first transistor is greater than or less than the at least one parameter value; or
whether the current produced by the second transistor is greater than or less than the at least one parameter value.

Example aspect 17: The apparatus of any one of example aspects 14-16, wherein the fault handler circuitry is configured to select as the mirrored current the current produced by the first transistor or the current produced by the second transistor based on which current has a greater magnitude.

Example aspect 18: The apparatus of example aspect 17, wherein:
the current mirror comprises a third transistor comprising a control terminal coupled to the control terminal of the core transistor; and
the fault handler circuitry is configured to select as the mirrored current the current produced by the first transistor, the current produced by the second transistor, or a current produced by the third transistor based on which current has a greatest magnitude.

Example aspect 19: The apparatus of any one of the preceding example aspects, further comprising:
a load; and
a current source coupled between the fault handler circuitry and the load, the current source configured to provide a current for the load based on the mirrored current of the current mirror.

Example aspect 20: The apparatus of any one of the preceding example aspects, wherein:
the core transistor comprises a channel terminal that is coupled to the control terminal of the core transistor; and
the current mirror is configured to:
mirror a current flowing through the core transistor as a current flowing through the first transistor; and
mirror the current flowing through the core transistor as a current flowing through the second transistor.

Example aspect 21: The apparatus of example aspect 20, wherein:
the control terminal of the core transistor comprises a gate terminal of the core transistor; and
the channel terminal of the core transistor comprises a drain terminal of the core transistor.

Example aspect 22: The apparatus of any one of the preceding example aspects, wherein:
the current mirror comprises a third transistor comprising a control terminal coupled to the control terminal of the core transistor; and
the fault handler circuitry is configured to select the first transistor, the second transistor, or the third transistor to provide the mirrored current of the current mirror.

Example aspect 23: The apparatus of any one of the preceding example aspects, further comprising:
a wireless interface device,
wherein the wireless interface device comprises the current mirror and the fault handler circuitry.

Example aspect 24: The apparatus of example aspect 23, wherein:
the wireless interface device comprises a radio-frequency component that is configured to operate at a radio frequency; and
the radio-frequency component comprises the current mirror.

Example aspect 25: An apparatus for robust transistor circuitry, the apparatus comprising:
core means for providing a core current;
first means for mirroring the core current as a first current;
second means for mirroring the core current as a second current; and means for handling a fault of the first means or the second means by selecting the second current or the first current as a mirrored current.

Example aspect 26: The apparatus of example aspect 25, further comprising:
means for processing a radio-frequency signal, the means for processing comprising the core means, the first means, and the second means.

Example aspect 27: The apparatus of example aspect 25 or example aspect 26, wherein the means for handling the fault comprises:
means for mirroring the first current or the second current as the mirrored current based at least on a greater magnitude of the first current or the second current.

Example aspect 28: The apparatus of any one of example aspects 25-27, wherein the means for handling the fault comprises:
means for detecting a parameter associated with the first current and a parameter associated with the second current;
means for comparing the parameter associated with the first current and the parameter associated with the second current; and
means for selecting the first current or the second current as the mirrored current based on the means for comparing.

Example aspect 29: A method for operating robust transistor circuitry, the method comprising:
mirroring a core current as a first current;
mirroring the core current as a second current;
detecting a parameter associated with the first current and a parameter associated with the second current;
comparing the parameter associated with the first current and the parameter associated with the second current; and
selecting the first current or the second current as a mirrored current based on the comparing.

Example aspect 30: The method of example aspect 29, further comprising:
applying the mirrored current to a load in a radio-frequency section of a wireless interface device.

Example aspect 31: The method of example aspect 29 or example aspect 30, wherein:
the detecting comprises:
directing the first current through a first component to produce a first voltage; and
directing the second current through a second component to produce a second voltage;
the comparing comprises comparing the first voltage and the second voltage; and
the selecting comprises selecting the first current or the second current as the mirrored current based on the comparing of the first voltage and the second voltage.

Example aspect 32: The method of any one of example aspects 29-31, wherein:
the detecting comprises:
detecting a magnitude of the first current; and
detecting a magnitude of the second current;
the comparing comprises comparing the magnitude of the first current and the magnitude of the second current; and
the selecting comprises selecting the first current or the second current as the mirrored current based on the comparing of the magnitude of the first current and the magnitude of the second current.

Example aspect 33: The method of example aspect 32, wherein:
the detecting comprises:
routing the first current to a channel terminal of a first transistor;
routing the second current to a channel terminal of a second transistor;
routing the first current to a control terminal of a third transistor; and
routing the second current to a control terminal of a fourth transistor; the comparing comprises:
turning on the third transistor based on the routing of the first current; and
turning on the fourth transistor based on the routing of the second current; and
the selecting comprises:
mirroring the first current flowing through the first transistor to a fifth transistor based on the turning on of the third transistor; or
mirroring the second current flowing through the second transistor to the fifth transistor based on the turning on of the fourth transistor.

Example aspect 34: The method of any one of example aspects 29-33, wherein the detecting, the comparing, and the selecting are performed, at least partially, by a winner-take-all (WTA) circuit.

Example aspect 35: An apparatus for robust transistor circuitry, the apparatus comprising:
at least one integrated circuit component configured to produce multiple currents; and
a winner-take-all (WTA) circuit coupled to the at least one integrated circuit component, the WTA circuit configured to:
select a current of the multiple currents; and
apply the current to another component.

Example aspect 36: The apparatus of example aspect 35, wherein the WTA circuit comprises:
multiple current analysis circuits, each respective current analysis circuit configured to:
receive a corresponding current of the multiple currents; and
produce a respective current based on the corresponding current that is received, each respective current having a magnitude that is dependent, at least partly, on the corresponding current that is received.

Example aspect 37: The apparatus of example aspect 36, wherein:
the WTA circuit comprises a current source configured to sink or source the current with respect to the other component; and
the WTA circuit is configured to mirror the respective current having at least a greater magnitude from a respective current analysis circuit to the current source as the current applied to the other component.

Example aspect 38: The apparatus of any one of example aspects 35-37, wherein the WTA circuit comprises:
a first transistor comprising a channel terminal coupled to the at least one integrated circuit component;
a second transistor comprising a channel terminal coupled to the at least one integrated circuit component;
a third transistor coupled between the channel terminal of the first transistor and a control terminal of the first transistor; and
a fourth transistor coupled between the channel terminal of the second transistor and a control terminal of the second transistor.

Example aspect 39: The apparatus of example aspect 38, further comprising:
a first electrical path coupled between the at least one integrated circuit component and the channel terminal of the first transistor, the channel terminal of the first transistor configured to receive a first current of the multiple currents from the at least one integrated circuit component via the first electrical path; and
a second electrical path coupled between the at least one integrated circuit component and the channel terminal of the second transistor, the channel terminal of the second transistor configured to receive a second current of the multiple currents from the at least one integrated circuit component via the second electrical path.

Example aspect 40: The apparatus of example aspect 38 or example aspect 39, wherein:
the control terminal of the first transistor is coupled to the control terminal of the second transistor; and
the WTA circuit comprises a fifth transistor comprising:
a control terminal coupled to the control terminal of the first transistor and the control terminal of the second transistor; and
a channel terminal that is coupled to the other component.

Example aspect 41: The apparatus of any one of example aspects 38-40, wherein:
the third transistor comprises:
a control terminal coupled to the channel terminal of the first transistor; and
a channel terminal coupled to the control terminal of the first transistor; and
the fourth transistor comprises:
a control terminal coupled to the channel terminal of the second transistor; and
a channel terminal coupled to the control terminal of the second transistor.

Example aspect 42: The apparatus of any one of example aspects 35-41, wherein:
the at least one integrated circuit component comprises at least part of a component that is configured to convert between analog signals and digital signals.

Example aspect 43: The apparatus of any one of example aspects 35-42, wherein:
the at least one integrated circuit component comprises at least one radio-frequency component configured to produce the multiple currents.

Example aspect 44: The apparatus of example aspect 43, wherein:
the other component comprises another radio-frequency component; and
the WTA circuit is configured to apply the current to the other radio-frequency component.

Example aspect 45: The apparatus of example aspect 43 or example aspect 44, wherein:
the at least one radio-frequency component comprises a first radio-frequency component and a second radio-frequency component; and
the multiple currents comprise a first operational current of the first radio-frequency component and a second operational current of the second radio-frequency component.

Example aspect 46: The apparatus of example aspect 45, wherein:
the first radio-frequency component comprises a first portion of a phase-locked loop (PLL);
the second radio-frequency component comprises a second portion of the phase-locked loop, the second portion corresponding to a replica of the first portion; and
the other component comprises a third portion of the phase-locked loop.

Example aspect 47: The apparatus of example aspect 45, wherein:
the first radio-frequency component comprises a first power management integrated circuit (PMIC) configured to supply power to at least part of a radio-frequency section of a wireless interface device; and
the second radio-frequency component comprises a second power management integrated circuit configured to supply power to the at least part of the radio-frequency section of the wireless interface device.

As used herein, "couple," "coupled," or "coupling" refers to a relationship between two or more components that are in operative communication magnetically, electromagnetically, or by being electrically connected to implement some feature or realize some capability that is described. The term "connect," "connected," or "connecting" refers to an electrical connection using a physical line, such as a metal trace or wire. In some cases, an electrical connection can include a resistor, a capacitor, an inductor, a transistor, and so forth. A connection can include a direct connection or an indirect connection. A direct connection refers to connecting discrete circuit elements via a same node without an intervening element. An indirect connection refers to connecting discrete circuit elements via one or more other devices or other discrete circuit elements.

The terms "first," "second," "third," and other numeric-related indicators or differentiators are used herein to identify or distinguish similar or analogous items from one another within a given context. Here, such contexts can include a particular implementation, a given component, a single drawing figure or a group of related drawing figures, or a claim. Thus, a first item in one context may be the same as or may differ from a first item in another context. For example, an item identified as a "first signal" or a "first transistor" in one context may be identified for clarity purposes as a "second signal" or a "third transistor," respectively, in another context. Although various items and components that are illustrated in the drawings may be coupled together using single lines, the connecting lines and the associated items and components may operate with differential signaling or single-ended signaling.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to

What is claimed is:

1. An apparatus comprising:
   a current mirror comprising:
      a core transistor comprising a control terminal;
      a first transistor comprising a control terminal coupled to the control terminal of the core transistor, the first transistor configured to propagate a first current through the first transistor; and
      a second transistor comprising a control terminal coupled to the control terminal of the core transistor, the second transistor configured to propagate a second current through the second transistor; and
   fault handler circuitry coupled to the current mirror, the fault handler circuitry configured to select the first transistor or the second transistor to provide a mirrored current of the current mirror, the fault handler circuitry comprising a winner-take-all (WTA) circuit that comprises:
      a first transistor having a channel terminal coupled to a channel terminal of the first transistor of the current mirror, the first transistor of the WTA circuit configured to propagate the first current through the first transistor of the WTA circuit;
      a second transistor having a channel terminal coupled to a channel terminal of the second transistor of the current mirror, the second transistor of the WTA circuit configured to propagate the second current through the second transistor of the WTA circuit;
      a third transistor coupled between the channel terminal of the first transistor of the WTA circuit and a control terminal of the first transistor of the WTA circuit; and
      a fourth transistor coupled between the channel terminal of the second transistor of the WTA circuit and a control terminal of the second transistor of the WTA circuit.

2. The apparatus of claim 1, wherein the WTA circuit is configured to:
   detect a particular current having a greater magnitude of the first current flowing through the first transistor and the second current flowing through the second transistor; and
   provide the particular current as the mirrored current.

3. The apparatus of claim 1, wherein:
   the control terminal of the first transistor of the WTA circuit is coupled to the control terminal of the second transistor of the WTA circuit; and
   the WTA circuit is configured to control the mirrored current using at least one of the control terminal of the first transistor of the WTA circuit or the control terminal of the second transistor of the WTA circuit.

4. The apparatus of claim 1, wherein:
   the third transistor comprises:
      a control terminal coupled to the channel terminal of the first transistor of the WTA circuit;
      a first channel terminal coupled to the control terminal of the first transistor of the WTA circuit; and
      a second channel terminal coupled to a power distribution node; and
   the fourth transistor comprises:
      a control terminal coupled to the channel terminal of the second transistor of the WTA circuit;
      a first channel terminal coupled to the control terminal of the second transistor of the WTA circuit; and
      a second channel terminal coupled to the power distribution node.

5. The apparatus of claim 1, wherein the WTA circuit comprises:
   a current source coupled between the control terminal of the first transistor of the WTA circuit and a power distribution node.

6. The apparatus of claim 1, wherein the fault handler circuitry is configured to select the second transistor of the current mirror to provide the mirrored current of the current mirror responsive to a fault of the first transistor of the current mirror.

7. The apparatus of claim 6, wherein the fault handler circuitry is configured to detect the fault of the first transistor of the current mirror.

8. The apparatus of claim 7, wherein the fault of the first transistor of the current mirror comprises at least one parameter corresponding to the first transistor of the current mirror being outside a range for the at least one parameter.

9. The apparatus of claim 7, wherein the fault of the first transistor of the current mirror comprises at least one parameter corresponding to the first transistor of the current mirror being lower in quality than at least one parameter corresponding to the second transistor of the current mirror.

10. The apparatus of claim 9, wherein:
    the at least one parameter corresponding to the first transistor of the current mirror comprises a magnitude of the first current flowing through the first transistor of the current mirror; and
    the at least one parameter corresponding to the second transistor of the current mirror comprises a magnitude of the second current flowing through the second transistor of the current mirror.

11. The apparatus of claim 10, wherein a current having a smaller magnitude has a lower quality than another current having a larger magnitude compared to the smaller magnitude.

12. The apparatus of claim 1, wherein the fault handler circuitry is configured to select the first current produced by the first transistor of the current mirror or the second current produced by the second transistor of the current mirror as the mirrored current of the current mirror.

13. The apparatus of claim 12, wherein the fault handler circuitry is configured to select as the mirrored current the first current produced by the first transistor of the current mirror or the second current produced by the second transistor of the current mirror based on at least one parameter value.

14. The apparatus of claim 13, wherein the fault handler circuitry is configured to select as the mirrored current the first current produced by the first transistor of the current mirror or the second current produced by the second transistor of the current mirror based on at least one of:
    whether the first current produced by the first transistor of the current mirror is greater than or less than the at least one parameter value; or
    whether the second current produced by the second transistor of the current mirror is greater than or less than the at least one parameter value.

15. The apparatus of claim 12, wherein the fault handler circuitry is configured to select as the mirrored current the first current produced by the first transistor of the current mirror or the second current produced by the second transistor of the current mirror based on which current has a greater magnitude.

16. The apparatus of claim 15, wherein:
the current mirror comprises a third transistor comprising a control terminal coupled to the control terminal of the core transistor, the third transistor of the current mirror configured to propagate a third current through the third transistor of the current mirror; and
the fault handler circuitry is configured to select as the mirrored current the first current produced by the first transistor of the current mirror, the second current produced by the second transistor of the current mirror, or the third current produced by the third transistor of the current mirror based on which current has a greatest magnitude.

17. The apparatus of claim 1, further comprising:
a load; and
a current source coupled between the fault handler circuitry and the load, the current source configured to provide a current for the load based on the mirrored current of the current mirror.

18. The apparatus of claim 1, wherein:
the core transistor comprises a channel terminal that is coupled to the control terminal of the core transistor; and
the current mirror is configured to:
mirror a current flowing through the core transistor as the first current flowing through the first transistor of the current mirror; and
mirror the current flowing through the core transistor as the second current flowing through the second transistor of the current mirror.

19. The apparatus of claim 18, wherein:
the control terminal of the core transistor comprises a gate terminal of the core transistor; and
the channel terminal of the core transistor comprises a drain terminal of the core transistor.

20. An apparatus comprising:
a current mirror comprising:
a core transistor comprising a control terminal;
a first transistor comprising a control terminal coupled to the control terminal of the core transistor;
a second transistor comprising a control terminal coupled to the control terminal of the core transistor; and
a third transistor comprising a control terminal coupled to the control terminal of the core transistor; and
fault handler circuitry coupled to the current mirror, the fault handler circuitry is configured to select the first transistor of the current mirror, the second transistor of the current mirror, or the third transistor of the current mirror to provide a mirrored current of the current mirror, the fault handler circuitry comprising a winner-take-all (WTA) circuit that comprises:
a first transistor having a channel terminal coupled to a channel terminal of the first transistor of the current mirror;
a second transistor having a channel terminal coupled to a channel terminal of the second transistor of the current mirror;
a third transistor coupled between the channel terminal of the first transistor of the WTA circuit and a control terminal of the first transistor of the WTA circuit; and
a fourth transistor coupled between the channel terminal of the second transistor of the WTA circuit and a control terminal of the second transistor of the WTA circuit.

21. The apparatus of claim 1, further comprising:
a wireless interface device,
wherein the wireless interface device comprises the current mirror and the fault handler circuitry.

22. The apparatus of claim 21, wherein:
the wireless interface device comprises a radio-frequency component that is configured to operate at a radio frequency; and
the radio-frequency component comprises the current mirror.

23. A method for operating robust transistor circuitry, the method comprising:
mirroring a core current as a first current via a first transistor;
mirroring the core current as a second current via a second transistor;
detecting a parameter associated with the first current that is indicative of a fault condition of the first transistor and a parameter associated with the second current that is indicative of a fault condition of the second transistor, the detecting comprising:
routing the first current to a channel terminal of a third transistor;
routing the second current to a channel terminal of a fourth transistor;
routing the first current to a control terminal of a fifth transistor; and
routing the second current to a control terminal of a sixth transistor;
comparing the parameter associated with the first current and the parameter associated with the second current; and
selecting the first current or the second current as a mirrored current based on the comparing.

24. The method of claim 23, further comprising:
applying the mirrored current to a load in a radio-frequency section of a wireless interface device.

25. The method of claim 23, wherein:
the fault condition of the first transistor comprises a faulty first transistor; and
the fault condition of the second transistor comprises a faulty second transistor.

26. The method of claim 23, wherein:
the detecting comprises:
detecting a magnitude of the first current; and
detecting a magnitude of the second current;
the comparing comprises comparing the magnitude of the first current and the magnitude of the second current; and
the selecting comprises selecting the first current or the second current as the mirrored current based on the comparing of the magnitude of the first current and the magnitude of the second current.

27. The method of claim 26, wherein:
the comparing comprises:
turning on the fifth transistor based on the routing of the first current; and
turning on the sixth transistor based on the routing of the second current; and
the selecting comprises:
mirroring the first current flowing through the third transistor to a seventh transistor based on the turning on of the fifth transistor; or
mirroring the second current flowing through the fourth transistor to the seventh transistor based on the turning on of the sixth transistor.

28. The method of claim 23, wherein the detecting, the comparing, and the selecting are performed, at least partially, by a winner-take-all (WTA) circuit.

29. An apparatus for robust transistor circuitry, the apparatus comprising:
at least one integrated circuit component configured to produce multiple currents; and
a winner-take-all (WTA) circuit coupled to the at least one integrated circuit component, the WTA circuit configured to:
select a current of the multiple currents; and
apply the current to another component, the WTA circuit comprising:
a first transistor comprising a channel terminal coupled to the at least one integrated circuit component;
a second transistor comprising a channel terminal coupled to the at least one integrated circuit component;
a third transistor directly coupled between the channel terminal of the first transistor and a control terminal of the first transistor; and
a fourth transistor directly coupled between the channel terminal of the second transistor and a control terminal of the second transistor.

30. The apparatus of claim 29, wherein the WTA circuit comprises:
multiple current analysis circuits, each respective current analysis circuit configured to:
receive a corresponding current of the multiple currents; and
produce a respective current based on the corresponding current that is received, each respective current having a magnitude that is dependent, at least partly, on the corresponding current that is received.

31. The apparatus of claim 30, wherein:
the WTA circuit comprises a current source configured to sink or source the current with respect to the other component; and
the WTA circuit is configured to mirror the respective current having at least a greater magnitude from a respective current analysis circuit to the current source as the current applied to the other component.

32. The apparatus of claim 29, further comprising:
a first electrical path coupled between the at least one integrated circuit component and the channel terminal of the first transistor, the channel terminal of the first transistor configured to receive a first current of the multiple currents from the at least one integrated circuit component via the first electrical path; and
a second electrical path coupled between the at least one integrated circuit component and the channel terminal of the second transistor, the channel terminal of the second transistor configured to receive a second current of the multiple currents from the at least one integrated circuit component via the second electrical path.

33. The apparatus of claim 29, wherein:
the control terminal of the first transistor is coupled to the control terminal of the second transistor; and
the WTA circuit comprises a fifth transistor comprising:
a control terminal coupled to the control terminal of the first transistor and the control terminal of the second transistor; and
a channel terminal that is coupled to the other component.

34. The apparatus of claim 33, wherein:
the third transistor comprises:
a control terminal coupled to the channel terminal of the first transistor; and
a channel terminal coupled to the control terminal of the first transistor; and
the fourth transistor comprises:
a control terminal coupled to the channel terminal of the second transistor; and
a channel terminal coupled to the control terminal of the second transistor.

35. The apparatus of claim 29, wherein:
the at least one integrated circuit component comprises at least part of a component that is configured to convert between analog signals and digital signals.

36. The apparatus of claim 29, wherein:
the at least one integrated circuit component comprises at least one radio-frequency component configured to produce the multiple currents.

37. The apparatus of claim 36, wherein:
the other component comprises another radio-frequency component; and
the WTA circuit is configured to apply the current to the other radio-frequency component.

38. The apparatus of claim 36, wherein:
the at least one radio-frequency component comprises a first radio-frequency component and a second radio-frequency component; and
the multiple currents comprise a first operational current of the first radio-frequency component and a second operational current of the second radio-frequency component.

39. The apparatus of claim 38, wherein:
the first radio-frequency component comprises a first portion of a phase-locked loop (PLL);
the second radio-frequency component comprises a second portion of the phase-locked loop, the second portion corresponding to a replica of the first portion; and
the other component comprises a third portion of the phase-locked loop.

40. The apparatus of claim 38, wherein:
the first radio-frequency component comprises a first power management integrated circuit (PMIC) configured to supply power to at least part of a radio-frequency section of a wireless interface device; and
the second radio-frequency component comprises a second power management integrated circuit configured to supply power to the at least part of the radio-frequency section of the wireless interface device.

* * * * *